(12) United States Patent
Endo

(10) Patent No.: US 7,012,260 B2
(45) Date of Patent: Mar. 14, 2006

(54) RADIATION IMAGE PICK-UP DEVICE AND RADIATION IMAGE PICK-UP METHOD

(75) Inventor: Tadao Endo, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/097,223

(22) Filed: Apr. 4, 2005

(65) Prior Publication Data

US 2005/0173645 A1 Aug. 11, 2005

Related U.S. Application Data

(63) Continuation of application No. PCT/JP04/17661, filed on Nov. 22, 2004.

(30) Foreign Application Priority Data

Dec. 5, 2003 (JP) ............................. 2003-408032

(51) Int. Cl.
*G01T 1/24* (2006.01)

(52) U.S. Cl. ............................. 250/370.11; 250/370.09

(58) Field of Classification Search ........... 250/370.09, 250/370.11

See application file for complete search history.

(56) References Cited

U.S. PATENT DOCUMENTS 6,653,636 B1 * 11/2003 Busse et al. ............ 250/370.09
2002/0190215 A1 * 12/2002 Tashiro et al. ......... 250/370.11

FOREIGN PATENT DOCUMENTS

| EP | 1267411 A2 * | 12/2002 |
| JP | H08-116044 | 5/1996 |
| JP | H11-307756 | 11/1999 |

* cited by examiner

*Primary Examiner*—Constantine Hannaher
(74) *Attorney, Agent, or Firm*—Fitzpatrick, Cella, Harper & Scinto

(57) ABSTRACT

A radiation image pick-up device which can restrain voltage fluctuations on GND and power supply lines, dispense with frame-by-frame wait periods, make possible stable and high speed moving image photographing, and are reduced in cost and dark current is to be provided.

In pixels for detecting incident radiations, there are provided MIS-type conversion elements for converting the radiations into electric signals, source follower-type first TFTs for reading out the electric signals, second TFTs which so operate as to read out of the first TFTs the electric signals of the conversion elements selected by a drive circuit section on a row-by-row basis, and third TFTs which so operate as to reset or refresh on a row-by-row basis the conversion elements out of which reading by the first TFTs has been accomplished.

10 Claims, 16 Drawing Sheets

REFRESH MODE

PHOTOELECCTRIC
CONVERSION MODE

SATURATED STATE

RADIATION IMAGE PICK-UP DEVICE AND RADIATION IMAGE PICK-UP METHOD

This application is a continuation of International Application No. PCT/JP2004/017661, filed on Nov. 22, 2004, which claims the benefit of Japanese Patent Application No. 2003-408032 filed on Dec. 5, 2003.

BACKGROUND OF THE INVENTION

1. Field of the Invention

The present invention relates to a radiation image pick-up device and a radiation image pick-up method which can be suitably used in medical diagnoses and industrial non-destructive inspections. Radiations in the context of this specification include the X-ray, γ-ray, α-ray and β-ray.

2. Related Background Art

X-ray photographing systems conventionally installed in hospitals and elsewhere use either one of two systems, the film photographing system by which a film is exposed to X-rays irradiating and transmitted by a patient and the image processing system by which X-rays transmitted by a patient are converted into electric signals and subjected to digital image processing.

One of the available devices for realizing an image processing system is a radiation image pick-up device equipped with a phosphor for converting X-rays into visible light and a photoelectric conversion device for converting visible light into electric signals. The X-rays transmitted by a patient irradiate the phosphor, and internal information on the patient's body converted by the phosphor into visible light is supplied by the photoelectric conversion device as electric signals. If the internal information on the patient's body is converted into electric signals, those electric signals can be converted by an A/D converter into digital signals, enabling X-ray image information to be recorded, displayed, printed or used in diagnosis to be handled as digital values.

Recently, a radiation image pick-up device using an amorphous silicon semiconductor film for the photoelectric conversion device has come into practical use.

FIG. 10 shows a plan of a conventional photoelectric conversion substrate using amorphous silicon semiconductor films as materials for an MIS type photoelectric conversion element and a switching element, described in the Japanese Patent Application Laid-Open No. H08-116044, and the illustration includes wiring for connecting them.

FIG. 11 shows a section cut along line 11—11 in FIG. 10. In the following description, the MIS type photoelectric conversion element will be referred to merely as photoelectric conversion element for the sake of simplicity.

As shown in FIG. 11, photoelectric conversion elements 101 and switching elements 102 (amorphous silicon TFTs, hereinafter referred to simply as TFTs) are formed over the same substrate 103. The lower electrodes of the photoelectric conversion elements 101 are formed of the same first metallic film layer 104 as the lower electrodes (gate electrodes) of the TFTs 102, and the upper electrodes of the photoelectric conversion elements 102 are formed of the same second metallic film layer 105 as the upper electrodes (source electrodes and drain electrodes) of the TFTs 102.

The first and second metallic film layers 104 and 105 are also formed in and shared by gate drive wirings 106 and matrix signal wirings 107 within a photoelectric conversion circuit section (radiation detecting circuit section) shown in FIG. 10. An equivalent of 2×2=4 pixels is shown in FIG. 10, wherein hatched parts are light receiving faces of the photoelectric conversion elements 101. Reference numeral 109 denotes power supply lines which bias the photoelectric conversion elements, and 110, contact holes for connecting the photoelectric conversion elements 101 and the TFTs 102.

The use of the configuration having an amorphous silicon semiconductor as the main material as shown in FIG. 10 enables the photoelectric conversion elements 101, switching elements 102, gate drive wirings 106 and matrix signal wirings 107 to be fabricated over the same substrate at the same time, and thereby makes it possible to provide a photoelectric conversion circuit section (radiation detecting circuit section) of a large area easily and, moreover, at low cost.

Next will be described the device operations of the photoelectric conversion elements 101 with reference to FIGS. 12A to 12C.

FIGS. 12A to 12C are energy band diagrams illustrating the device operations of the photoelectric conversion elements 101 shown in FIG. 10 and FIG. 11.

FIGS. 12A and 12B show operations in a refresh mode and a photoelectric conversion mode, respectively, wherein the horizontal axis represents the state of each layer shown in FIG. 11 in the direction of its film thickness. Here, M1 denotes a lower electrode (G electrode) formed of the first metallic film layer 104, which may consist of Cr for instance. An amorphous silicon nitride (a-SiNx) insulating thin film layer 111 is an insulating layer stopping the passage of both electrons and holes. It requires a sufficient thickness not to give rise to a tunnel effect, and is usually formed to a thickness of 50 nm or more.

An amorphous silicon hydride (a-Si:H) thin film layer 112 is a photoelectric conversion semiconductor layer formed of an intrinsic semiconductor layer (i layer) deliberately not doped with a dopant. An $N^+$ layer 113 is an injection stopping layer of a single conduction type carrier consisting of a non-single crystal semiconductor, such as an N-type amorphous silicon hydride thin film layer, formed to stop injection of holes into the amorphous silicon hydride thin film layer 112. M2 denotes an upper electrode (D electrode) formed of the second metallic thin film layer 105 of Al for instance.

Although the D electrode, which is the upper electrode, does not fully cover the $N^+$ layer 113 in FIG. 10, the D electrode and the $N^+$ layer 113 are always at the same potential because electrons freely move back and forth between the D electrode and the $N^+$ layer 113, and the following description will presuppose this.

The device operations of the photoelectric conversion element 101 comprise two modes of operation including the refresh mode and the photoelectric conversion mode, differing with the way in which voltages are applied to the D electrode and the G electrode.

In the refresh mode shown in FIG. 12A, the negative potential is given to the D electrode relative to the G electrode, and holes, represented by black circles in the diagram, in the i layer 112 are guided to the D electrode by an electric field. At the same time, electrons, represented by white circles in the diagram, are injected into the i layer 112. In this process, some of the holes and electrons are recombined in the $N^+$ layer 113 and in the i layer 112, and disappear. If this state stays on long enough, the holes will be swept out of the i layer 112.

In order to shift from the above-described state to the photoelectric conversion mode shown in FIG. 12B, the D electrode is provided with a positive potential relative to the G electrode. This causes electrons in the i layer 112 to be instantaneously guided to the D electrode. However, holes are not guided to the i layer 112 because the $N^+$ layer 113 functions as the injection stopping layer for them. When light comes incident on the i layer 112 in this state, light is absorbed to give rise to electron-hole pairs. These electrons are guided by an electric field to the D electrode. On the other hand, the holes move within the i layer 112 and reach the interface between the i layer 112 and the amorphous silicon nitride insulating thin film layer 111, but they remain within the i layer 112 because they cannot move into this insulating layer 111. Then, as the electrodes move to the D electrode and the holes move to the interface of the i layer 112 with the insulating layer, a current flows from the G electrode to keep the electric neutrality within the photoelectric conversion element 101. This current, since it matches the electron-hole pairs generated by light, is proportional to the incident light.

When the refresh mode shown in FIG. 12A is resumed after the state in the photoelectric conversion mode of FIG. 12B is maintained for some time, holes staying in the i layer 112 are guided to the D electrode as described above, and a current matching these holes flows. The quantity of these holes matches the total quantity of light having come incident during the period in the photoelectric conversion mode. Then a current matching the quantity of electrons injected into the i layer 112 also flows, but this quantity can be subtracted in detection because it is substantially constant. In other words, this photoelectric conversion element 101 can detect not only the quantity of light coming incident on a real time basis but also the total quantity of light having come incident during a certain period of time.

However, if the duration of the photoelectric conversion mode becomes unusually long or the illuminance of the incident light is unusually intense for some reason or other, a current may fail to flow even though light does come incident. Such a situation occurs when, as shown in FIG. 12C, many holes remain in the i layer 112 and reduce the electric field in the i layer 112, and the generated electrons are not guided and become recombined with the holes in the i layer 112. Such a state is known as the saturated state of the photoelectric conversion element 101. If the condition of light incidence varies in this state, a current may flow unstably, but if the refresh mode is resumed, the holes in the i layer 112 will be swept out, and a current proportional to the light will flow again in the next photoelectric conversion mode.

When holes in the i layer 112 are to be swept out in the refresh mode as described above, though it is ideal to sweep out all the holes, sweeping out some of the holes would still be effective and an equal current to what was described above could be obtained, involving no problem at all. Thus, it is sufficient for the saturated state of FIG. 12C to be present at the next opportunity for detection in the photoelectric conversion mode, and the potential of the G electrode relative to the D electrode in the refresh mode, the duration of the refresh mode and the characteristics of the injection stopping layer for the $N^+$ layer 113 can then be determined.

Further in the refresh mode, the injection of electrons into the i layer 112 is not a necessary condition, and the potential of the D electrode relative to the G electrode is not always required to be negative, because, in the presence of many holes in the i layer 112, even if the potential of the D electrode relative to the G electrode is positive, the electric field in the i layer 112 works in the direction of guiding the holes toward the D electrode. Furthermore, regarding the characteristics of the $N^+$ layer 113, which is the injection stopping layer, need not include the capability to inject electrons into the i layer 112 as a necessary condition.

FIG. 13 shows a one-pixel equivalent part of a photoelectric conversion circuit according to the prior art, whose configuration comprises a photoelectric conversion element 101 and a TFT 102.

Referring to FIG. 13, the photoelectric conversion element 101 contains a capacitance content Ci consisting of the i layer and another capacitance content $C_{SiN}$ consisting of the injection stopping layer. The junction point between the i layer and an injection stopping layer (node N in FIG. 13) can no longer allow hole carriers to accumulate in the N portion when the photoelectric conversion element 101 becomes saturated, namely when there is no (or little) electric field between the D electrode and the node N (i layer), because optically generated electrons and holes are then recombined.

In other words, the potential of the node N never becomes higher than that of the D electrode. To materialize the operations in this saturated state, a diode (D1) is connected in parallel to the capacitance content Ci in the configuration shown in FIG. 13. Thus, the photoelectric conversion element 101 has three constituent elements including the capacitance content Ci, the capacitance content $C_{SiN}$ and the diode D1.

FIG. 14 is a time chart showing the operations in the one-pixel equivalent part of the photoelectric conversion circuit shown in FIG. 13. The circuit operations of the pixel comprising the photoelectric conversion element 101 and the TFT 102 will be described below with reference to FIG. 13 and FIG. 14.

First, the refresh operation will be described.

Referring to FIG. 13, Vs is set to 9 V and Vref, to 3 V. In the refresh operation, a switch SW-A is turned to Vref, a switch SW-B to Vg (on) and a switch SW-C on. By achieving this state, the D electrode is biased to Vref (6V), the G electrode to a GND potential, and the node N to the maximum Vref (6V). The maximum in this context means that, if the potential of the node N was already accumulated to or above Vref by the photoelectric conversion operation before this refresh operation, the node N will be biased to Vref via the diode D1. On the other hand, if the prior photoelectric conversion did not raise the potential of the node N to any more than Vref, the node N will not be biased to the potential of Vref by this refresh operation. In actual use, if operations had been done a plurality of times in the past, the node N can be assumed to be virtually biased to Vref (6V) by this refresh operation.

Then, after the node N is biased to Vref, the switch SW-A is turned to the Vs side. This causes the D electrode to be biased to Vs (9V). By this refresh operation, hole carriers accumulated in the node N of the photoelectric conversion element 101 are swept away toward the D electrode.

Next, the period of irradiation with X-rays will be described.

As shown in FIG. 14, X-rays are radiated in a pulse form. The X-rays transmitted by the subject irradiate a phosphor F1 and are converted into visible light. The visible light from the phosphor F1 irradiates a semiconductor layer (i layer), and undergoes photoelectric conversion. Hole carriers generated by the photoelectric conversion are accumulated in the node N and raise its potential. As the TFT 102 in an off state, the potential on the G electrode side is raised as much.

The wait period intervenes between the refresh period and the X-ray irradiation period. Nothing particular is done in this wait period, which is a standby period provided against the instability of the characteristics of the photoelectric conversion element 101 caused by a dark current or the like immediately after the refresh operation so as to allow no operation to take place until the instability is eased. There is no particular need for a wait period if the characteristics of the photoelectric conversion element 101 are not unstable immediately after the refresh operation.

Next, a transfer operation will be described.

In the transfer operation, the switch SW-B is turned to the Vg (on) side to turn on the TFT 102. This causes electron carriers ($S_e$) matching the quantity of hole carriers ($S_h$) accumulated by irradiation with X-rays to flow from the read capacitance $C_2$ side toward the G electrode via the TFT 102 to raise the potential of the read capacitance $C_2$. The relationship between $S_e$ and $S_h$ then is $S_e = S_h \times C_{SiN}/(C_{SiN} + C_i)$. The potential of the read capacitance $C_2$ is at the same time amplified by an amplifier and outputted. The TFT 102 is kept on for a long enough period to allow sufficient signal charges to be transferred, and then turned off.

Finally, a reset operation will be described.

In the reset operation, the switch SW-C is turned on and the read capacitance $C_2$ is reset to the GND potential to prepare for the next transfer operation.

FIG. 15 is a two-dimensional circuit diagram of a conventional photoelectric conversion device.

For the sake of simplifying the illustration, only an equivalent of 3×3=9 pixels is shown in FIG. 15. Reference signs S1-1 through S3-3 denote photoelectric conversion elements; T1-1 through T3-3, switching elements (TFTs); G1 through G3, gate wirings for turning on and off the TFTs (T1-1 through T3-3); M1 through M3, signal wirings; and Vs-line, a wiring for providing an accumulated bias or a refresh bias to the photoelectric conversion elements (S1-1 through S3-3).

Referring to FIG. 15, the electrodes on the solidly black sides of the photoelectric conversion elements (S1-1 through S3-3) are G electrodes, and those on the opposite sides are D electrodes. Whereas the D electrodes share pat of the Vs-line, thin $N^+$ layers are used as the D electrodes for the convenience of letting light come incident. The photoelectric conversion elements (S1-1 through S3-3), the TFTs (T1-1 through T3-3), the gate wirings G1 through G3, the signal wirings M1 through M3 and the Vs-line are collectively referred to as the photoelectric conversion circuit section (radiation detecting circuit section) 701.

The Vs-line is biased by a power supply Vs or a power supply Vref, and they are switched over in response to control signals of VSC. Reference sign SR1 denotes a shift register for providing drive pulse voltages to the gate wirings G1 through G3, and voltages to turn on the TFTs (T1-1 through T3-3) are supplied from outside. The voltages to be supplied then are determined by the power supply Vg (on).

A read circuit section 702 amplifies the parallel signal outputs of the signal wirings M1 through M3 in the photoelectric conversion circuit section (radiation detecting circuit section) 701, converts them into series, and outputs the converted signals.

Reference signs RES1 through RES3 denote switches for resetting the signal wirings M1 through M3; A1 through A3, amplifiers for amplifying the signals of the signal wirings M1 through M3; CL1 through CL3, sample hold capacitances for temporarily storing the signals amplified by the amplifiers A1 through A3; Sn1 through Sn3, switches for performing sample holding; B1 through B3, buffer amplifiers; Sr1 through Sr3, switches for converting parallel signals into series; SR2, a shift register for providing the switches Sr1 through Sr3 with pulses for conversion into series; and Ab, a buffer amplifier for outputting the signals converted into series.

FIG. 16 is a time chart showing the operations in the photoelectric conversion device shown in FIG. 15. The operations of the photoelectric conversion device shown in FIG. 15 will be described below with reference to this time chart.

A control signal VSC is intended to provide two different kinds of biases to the Vs-line, namely to the D electrodes of the photoelectric conversion elements (S1-1 through S3-3). The D electrodes take on Vref (V) when the control signal VSC is "Hi" and Vs (V) when the control signal VSC is "Lo". Both the read power supply Vs (V) and the refresh power supply Vref (V) are DC power supplies.

First, operations in the refresh period will be described.

All the signals of the shift register SR1 are set to "Hi" and a CRES signal of the read circuit section 702 is set to "Hi". In this state, continuity is established for all the TFTs for switching use (T1-1 through T3-3) and for the switching elements RES1 through RES3 in the read circuit 702, and the G electrodes of all the photoelectric conversion elements (S1-1 through S3-3) take on the GND potential. Then, when the control signal VSC becomes "Hi", the D electrodes of all the photoelectric conversion elements (S1-1 through S3-3) enter into a state of being biased by a refresh power supply Vref (V) (negative potential). This places all the photoelectric conversion elements (S1-1 through S3-3) in the refresh mode, and refreshing takes place.

Next, the photoelectric conversion period will be described.

When the control signal VSC switched over to a "Lo" state, the D electrodes of all the photoelectric conversion elements (S1-1 through S3-3) enter into a state of being biased by a read power supply Vs (positive potential). In this way, the photoelectric conversion elements (S1-1 through S3-3) are placed in the photoelectric conversion mode. In this state, all the signals of the shift register SR1 are turned "Lo", and the CRES signal of the read circuit section 702 is turned "Lo". This causes all the TFTs for switching use (T1-1 through T3-3) to be turned off, and so are the switching elements RES1 through RES3 of the read circuit 702. The G electrodes of all the photoelectric conversion elements (S1-1 through S3-3) are placed in an open state on a DC basis, but the potential is maintained because the photoelectric conversion elements (S1-1 through S3-3) also have capacitance contents among their constituent elements.

Up to this point, no electric charge is generated because no light has come incident on the photoelectric conversion elements (S1-1 through S3-3). Namely, no current flows. When the light source is turned on in a pulse form in this state, light irradiates the D electrode ($N^+$ electrode) of each of the photoelectric conversion elements (S1-1 through S3-3), and a so-called photoelectric current flows. Though the light source is not represented in FIG. 15, it is a fluorescent lamp, an LED, a halogen lamp or the like in a copying machine for instance. In an X-ray image pick-up device, it is literally an X-ray source, and in this case a scintillator for conversion of X-rays into visible light can be used. The photoelectric current caused to flow by the light is accumulated in each of the photoelectric conversion elements (S1-1 through S3-3) as electric charges, and held even after the light source is turned off.

Next, the read period will be described.

The read operation takes in a sequence of the first row of photoelectric conversion elements (S1-1 through S1-3), then the second row of photoelectric conversion elements (S2-1 through S2-3) and finally the third row of photoelectric conversion elements (S3-1 through S3-3).

First to read out the photoelectric conversion elements (S1-1 through S1-3) of the first row, a gate pulse is given from SR1 to the gate wiring G1 of the switching element TFTs (T1-1 through T1-3). When this is done, the high level of the gate pulse is a voltage V (on) supplied from outside. The TFTs (T1-1 through T1-3) are thereby turned on, and signal charges accumulated in the photoelectric conversion elements (S1-1 through S1-3) of the first row are transferred to the signal wirings M1 through M3.

Though not represented in FIG. 15, read capacitances are added to the signal wirings M1 through M3, and signal charges are transferred to the read capacitances via the TFTs (T1-1 through T1-3). The read capacitance added to the signal wiring M1, for instance, is equivalent to the total of (three) capacitances between the gate and source electrodes (Cgs) of the TFTs (T1-1 through T3-1) connected to the signal wiring M1, and corresponds to the capacitance content $C_2$ in FIG. 13. The signal charges transferred to the signal wirings M1 through M3 are amplified by the amplifiers A1 through A3. By turning on the CRES signal, they are transferred to the sample hold capacitances CL1 through CL3 to turn off the CRES signal, and are held.

Then, by applying pulses from the shift register SR2 in the sequence of the switches Sr1, S2 and Sr3, the signals held by the sample hold capacitances CL1 through CL3 are outputted from the amplifier Ab in the sequence of the sample hold capacitances CL1, CL2 and CL3. As a result, photoelectrically converted signals equivalent to the first row of the photoelectric conversion elements (S1-1 through S1-3) are successively read out. Signals are read out in a similar way from the photoelectric conversion elements (S2-1 through S2-3) of the second row and the photoelectric conversion elements (S3-1 through S3-3) of the third row.

By sampling signals of the signal wirings M1 through M3 with an SMPL signal of the first row and holding them into the sample hold capacitances CL1 through CL3, it is made possible to resetting the signal wirings M1 through M3 to the GND potential with the CRES signal and to apply a gate pulse to the gate wiring G2 after that. Thus, while the signals of the first row are being subjected to conversion into series by the shift register SR2, the signal charges of the photoelectric conversion elements (S2-1 through S2-3) of the second row can be transferred by the shift register SR1 at the same time.

By the operations so far described, the signal charges of all the photoelectric conversion elements (S1-1 through S3-3) from the first through third rows can be outputted.

The operations of the X-ray image pick-up device described above constitute, so to speak, a sequence to acquire one still image by performing a refresh operation, irradiating the subject with X-rays and reading out the resultant signals. Where consecutive moving images are to be acquired, the operations shown in the time chart of FIG. 16 can be repeated as many as the number of desired moving images.

However, where moving images are to be acquired with an X-ray image pick-up device using a particularly large number of pixels, a further improvement in frame frequency will be required. Where an operation to refresh photoelectric conversion elements is to be carried out via a Vs-line which is common to all the photoelectric conversion elements, it is indispensable to secure one refresh period per frame. This gives rise to a particular problem that, when moving images are to be acquired, the frame frequency is reduced, namely the operation speed slows down.

The required area and pixel pitch for simple photographing of the chest are commonly said to be not less than 40 cm square and not more than 200 $\mu$m, respectively. Supposing that an X-ray image pick-up device having a photographing area of 40 cm square and a pixel pitch of 200 $\mu$m is to be fabricated, the number of photoelectric conversion elements will be as many as four million. Refreshing so vast a number of pixels at a time would entail a correspondingly larger current flowing at the time of refreshing, the GND potential and voltage fluctuations of the power supply line of the X-ray image pick-up device would become correspondingly greater, making it impossible to pick up images stably.

Depending on the requirements of the desired images, irradiation with X-rays would have to wait for some period until these fluctuations become reduced. Though not represented in FIG. 16, the wait period in FIG. 14 corresponds to this period. In other words, refreshing a photoelectric conversion device at a time would require not only one refresh period per frame but also one wait period per frame.

As described so far, the prior art according to which all the photoelectric conversion elements are refreshed once per frame of read operation involves a problem of difficulty to photograph moving images.

Moreover, if the photographing area is as large as 40 cm square, the capacitance of the signal wirings M1 through M3 will run up to somewhere between 50 pF and 100 pF. And if the photographic pixels are arranged at a 200 $\mu$m pitch, their capacitance will be about 1 pF to 3 pF. Supposing a signal wiring capacitance of 100 pF and a pixel capacitance of 2 pF and a transfer operation is carried out via TFTs, the signal voltage will drop to 2 pF/(2 pF+100 pF)≦1/50 before and after that. Similarly, the noise voltage will also drop, but there also is a problem that, because the noise components in the read circuit section 702 at the later stage, including so-called circuit noises such as thermal noise of resistances and the shot noise of transistors, are not zero, the eventual S/N ratio of the system will drop.

In order to make up for this drop in system S/N ratio, the circuit noise at the initial stage of the read circuit section 702 should be reduced. More specifically, the initial stage should be composed of an amplifier embodying considerably high standards of low noise design. To realize this, the element size of the transistors constituting the amplifier will become huge, resulting in a greatly increased chip size. This would invite a greater current consumption, and lead to a secondary problem of requiring a cooling mechanism against the resultant heat emission.

One way to solve this problem of S/N ratio drop is proposed in the Japanese Patent Application Laid-Open No. H11-307756, by which signal potentials from photoelectric conversion elements are entered into the gates of TFTs, and an output is obtained by using these TFTs as source followers. This method provides an advantage in terms of S/N ratio because output signals from the photoelectric conversion elements are entered into read circuits without suffering a drop.

However, voltages due to accumulated charges in the photoelectric conversion element are applied to the gate terminals of the source follower TFTs for a long period of time. There generally is a problem that TFTs mainly made of amorphous silicon suffer fluctuations in gate threshold voltage (Vth), the indicator for turning TFTs on, due to electric field stresses working on their gate terminals.

In the circuit configuration described in the Japanese Patent Application Laid-Open No. H11-307756, relative to the gate terminal voltage Vg of the source followers due to the accumulated charges in the photoelectric conversion elements, output signals suffering a drop corresponding to the threshold voltage Vth of the TFTs, are outputted from the source terminals at this reduced level. Thus, the output signal voltage is Vg-Vth. This voltage is entered into the read circuit section. Generally, the absolute maximum rating that can be applied to the input terminal of a read circuit (IC) composed of crystalline silicon is about 0.5 V relative to its photoelectric source voltage. There is a risk that the input rating of the read circuit may be surpassed if the threshold voltage Vth in the source follower TFTs varies, and if this risk actualizes, the read circuit may be destroyed.

Semiconductor processes are becoming increasingly fine today, and they are required to be reduced in source voltage and current consumption. As the power source for read circuits, a single 5 V source is coming into increasing use. Thus, both foreign and domestic requirements for the input voltage to read circuits are often 0 to 5 V, resulting in a constraint that threshold voltage Vth fluctuations of source follower type TFTs should be restricted to an extremely narrow range. In reality, the threshold voltage Vth of TFTs is uneven even at the time of shipment from the factory (at the time of TFT fabrication), and also varies while they are being operated. The Japanese Patent Application Laid-Open No. H11-307756 makes no mention of any solution to this problem of threshold voltage Vth fluctuations in TFTs.

Further, the photoelectric conversion elements according to the Japanese Patent Application Laid-Open No. H11-307756 are formed of PIN-type photodiodes. Since these PIN-type photodiodes require no refresh operation which MIS-type photoelectric conversion elements do require, they seem to be relatively free from the problem of difficulty in moving image picking-up ensuing from the refresh operation. However, they require two kinds of junctions including PI junction and IN junction, entailing a problem of an increased dark current. Especially the P layer is a layer unique to photoelectric conversion elements, and requires a completely different fabrication process from other TFTs fabricated over the same substrate. This means a laminated structure for which TFTs and photoelectric conversion elements have to be separately fabricated, involving disadvantages in yield and cost.

SUMMARY OF THE INVENTION

An object of the present invention, attempted to solve the problems noted above, is to provide a radiation image pick-up device and a radiation image pick-up method, which can restrain voltage fluctuations on GND and power supply lines, dispense with frame-by-frame wait periods, make possible stable and high speed moving image photographing, and are reduced in cost and dark current.

A radiation image pick-up device according to the invention has a radiation detecting circuit section in which a plurality of pixels for detecting incident radiations are two-dimensionally arranged over a substrate, and a drive circuit section for driving the radiation detecting circuit section, wherein the pixels comprise MIS-type conversion elements for converting the incident radiations into electric signals, source follower-type first field effect transistors for reading out electric signals resulting from the conversion by the conversion elements, second field effect transistors provided to read out the electric signals of the conversion elements selected row by row by the drive circuit section from the first field effect transistors, and third field effect transistors provided to reset or refresh row by row the conversion elements read out by the first field effect transistors.

In a radiation image pick-up device according to the invention in another mode, one type electrodes (the G electrodes) of the conversion elements are connected via the third field effect transistor to a first switch for switching between a reset bias for performing the resetting and a first refresh bias for performing the refreshing, and the other type electrodes (the D electrodes) of the conversion elements are connected via a bias wiring common to the individual conversion elements to a second switch for switching between a sensor bias for providing the converting operations of the conversion elements and a second refresh bias for refreshing the electric signals of the conversion elements.

In a radiation image pick-up device according to the invention in another mode, in the refreshing of the conversion elements, the first refresh bias is used for acquiring moving images and the second refresh bias is used for acquiring still images.

In a radiation image pick-up device according to the invention in another mode, at least one bias value out of the reset bias, the first refresh bias, the sensor bias and the second refresh bias is determined according to the gate threshold voltage (Vth) in the first field effect transistors.

In a radiation image pick-up device according to the invention in another mode, it further has a read circuit section for reading out output signals from the radiation detecting circuit section, and the read circuit section comprises amplifying means for amplifying the output signals from the radiation detecting circuit section, accumulating means for temporarily accumulating the amplified output signals, and serial conversion means for subjecting the accumulated output signals to serial conversion.

In a radiation image pick-up device according to the invention in another mode, the conversion elements, the first field effect transistors, the second field effect transistors, and the third field effect transistors are formed mainly of an amorphous silicon semiconductor.

In a radiation image pick-up device according to the invention in another mode, the conversion elements are configured to have a first metallic thin film layer formed over the substrate as a lower electrode, an insulating layer formed over the first metallic thin film layer and consisting of amorphous silicon nitride for obstructing the passage of electrons and positive holes, a photoelectric conversion layer formed over the insulating layer and consisting of amorphous silicon hydride, an N-type injection stopping layer formed over the photoelectric conversion layer to obstruct the injection of positive holes, and a transparent conducting layer formed as an upper electrode over the injection stopping layer or a second metallic film layer formed over part of the injection stopping layer; in a refresh mode, the conversion elements are given an electric field in the direction of guiding positive holes from the photoelectric conversion layer to the second metallic thin film layer; in a photoelectric conversion mode, the conversion elements are given an electric field to cause positive holes, generated by radiations coming incident on the photoelectric conversion layer, to stay in the photoelectric conversion layer and to guide electrons toward the second metallic film layer; and the positive holes accumulated in the photoelectric conversion layer in the photoelectric conversion mode or the electrons guided toward the second metallic thin film layer are detected as optical signals.

In a radiation image pick-up device according to the invention in another mode, it further has a wavelength converter for converting the wavelengths of the radiations.

In a radiation image pick-up device according to the invention in another mode, the wavelength converter has as its main content one of $Gd_2O_2S$, $Gd_2O_3$ and CsI.

A radiation image pick-up method according to the invention is a radiation image pick-up method for use in a radiation image pick-up device having a radiation detecting circuit section in which pixels provided with MIS-type conversion elements for converting incident radiations into electric signals, source follower-type first field effect transistors for reading out the electric signals, second field effect transistors provided to read out the electric signals of the selected one of said conversion elements from said first field effect transistors, and third field effect transistors provided to reset or refresh said conversion elements are two-dimensionally arranged over a substrate, and a drive circuit section for driving said radiation detecting circuit section, whereby, when the electric signals of said conversion elements are read out of said first field effect transistors, they are read out row by row by causing said drive circuit section to drive said second field effect transistors row by row, and said conversion elements out of which reading has been accomplished are reset or refreshed row by row by said third field effect transistors.

According to the invention, since the conversion elements out of which electric signals have been read out are refreshed (or reset) row by row, voltage fluctuations on GND and power supply lines can be restrained, frame-by-frame wait periods dispensed with, and stable and high speed moving image photographing made possible. Furthermore, as the conversion elements are in a MIS-type configuration, unlike the PIN-type configuration, a dark current can be suppressed and the radiation image pick-up device can be fabricated at lower cost. The realization of the radiation image pick-up device according to the invention would enable in particular a medical care environment of even higher quality than at present to serve the aging society of the future.

Also, as the electric signals of the conversion elements are read out via the source follower-type first field effect transistors, they can be read out without reducing the output signals of the conversion elements, resulting in a higher S/N ratio than the conventional radiation image pick-up device. Furthermore, as at least one bias value out of the reset bias, the first refresh bias, the sensor bias and the second refresh bias is determined according to the threshold voltage (Vth) in the first field effect transistors, even if the threshold voltage (Vth) of the first field effect transistors varies while the radiation image pick-up device is in use, for instance, the variation can be compensated for by varying the reset bias and the like accordingly. Therefore, the electric signals of the conversion elements can be stably outputted, making it possible to achieve a highly reliable radiation image pick-up device.

Also, since the photoelectric conversion elements 10, first field effect transistors, second field effect transistors and third field effect transistors constituting the pixels are mainly formed of an amorphous silicon semiconductor, the photoelectric conversion elements and the field effect transistors can be fabricated over the same substrate, enabling the yield of radiation image pick-up devices in the manufacturing process to be enhanced.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Now will be described a radiation image pick-up device and a radiation image pick-up method embodying the invention with reference to accompanying drawings. The following description of the preferred embodiment of the invention will refer to a radiation image pick-up device having a substrate over which a photoelectric conversion array is formed, the device using, as in the conventional device described above, MIS-type photoelectric conversion elements and, as the semiconductor material for field effect transistors, an amorphous silicon semiconductor film. Although the embodiment of the invention to be described uses the X-ray as radiations, the invention is not limited to them but the applicable radiations include electromagnetic waves such as the γ-ray as well as the α-ray and the β-ray.

Figure 1:
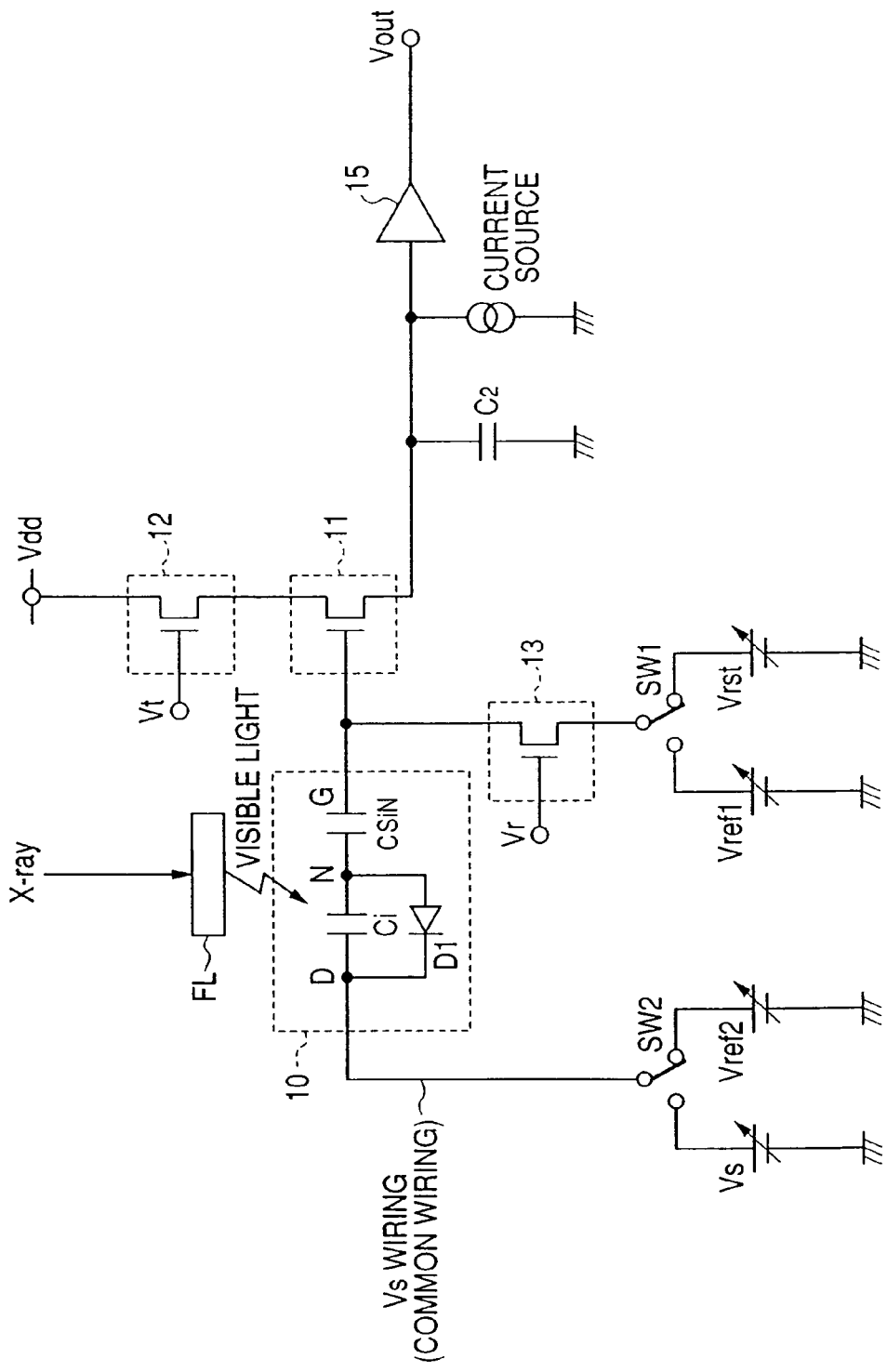
FIG. 1 is a circuit diagram of a one-pixel equivalent of an X-ray image pick-up device in one preferred embodiment of the invention.

FIG. 1 is a circuit diagram of a one-pixel equivalent of an X-ray image pick-up device in the preferred embodiment of the invention.

As shown in FIG. 1, an MIS-type photoelectric conversion element 10 contains a capacitance content Ci consisting of an i layer of amorphous silicon hydride or the like as a semiconductor photoelectric conversion layer and a capacitance content $C_{SiN}$ consisting of an insulating layer (an injection stopping layer of a double conduction type carrier) of amorphous silicon nitride or the like. The junction point between these i layer and injection stopping layer (node N in FIG. 1) can no longer allow hole carriers to accumulate in the N portion when the photoelectric conversion element 10 becomes saturated, namely when there is no (or little) electric field between the D electrode and the node N (i layer), because optically generated electrons and holes are then recombined.

In other words, the potential of the node N never becomes higher than that of the D electrode. To materialize the operations in this saturated state, a diode (D1) is connected in parallel to the capacitance content Ci in the configuration shown in FIG. 1. Thus, the photoelectric conversion element 10 has three constituent elements including the capacitance content Ci, the capacitance content $C_{SiN}$ and the diode D1.

Vref1 is a first refresh bias for refreshing the photoelectric conversion element 10 via a third TFT (13), and Vrst, a reset bias for resetting the photoelectric conversion element 10 similarly via the third TFT (13). Switching over between these biases is accomplished by selecting the connection of a first switch SW1. The third TFT (13) is a field effect transistor for resetting or refreshing the photoelectric conversion element 10, and functions as a switching element. Vs is a sensor bias for supplying a voltage to the D electrode of the photoelectric conversion element 10 for causing the photoelectric conversion element 10 to perform photoelectric conversion via a Vs wiring common to individual photoelectric conversion elements, and Vref2, a second refresh bias for refresh the photoelectric conversion element 10 via the Vs wiring common to individual photoelectric conversion elements. Switching over between these biases is accomplished by selecting the connection of a second switch SW2. All of these first refresh bias Vref1, reset bias Vrst, sensor bias Vs and second refresh bias Vref2 are variable power sources.

A first TFT (11) is a field effect transistor which provides an output toward an amplifier 15 without reducing the signal potentials accumulated in the photoelectric conversion element 10. It is a source follower type transistor to whose gate terminal the G electrode of the photoelectric conversion element 10 is connected. A second TFT (12) is a field effect transistor for selectively providing a drain bias Vdd to the drain terminal of the first TFT (11), and functions as a switching element. A capacitance content $C_2$ is a read capacitance parasitic on the source terminal of the first TFT (11). Reference sign FL designates a phosphor which absorbs X-rays and converts them into visible light.

The visible light resulting from conversion by the phosphor FL irradiates the MIS-type photoelectric conversion element 10, and undergoes photoelectric conversion by this photoelectric conversion element into electrons and positive holes. As stated above, the phosphor FL is a wavelength converting phosphor for conversion of X-ray wavelengths into wavelengths of the visible domain, and arranged in a position either directly or indirectly close to the TFT. As the parent material of this phosphor FL, $Gd_2O_2S$:Tb, $Gd_2O_3$:Tb, CsI:Tl, CsI:Na or the like is used. The material for the photoelectric conversion element 10, the first TFT (11), the second TFT (12) and the third TFT (13) is mainly amorphous silicon.

In this embodiment of the invention, when the signal charges accumulated in the photoelectric conversion element 10 are outputted to the amplifier 15 via the source follower-connected first TFT (11), the gate threshold voltage Vth of this first TFT (11) fluctuates in the process of use for instance, and the impact of fluctuations in the threshold voltage on the output is either reduced or eliminated by altering the reset bias Vrst.

For instance, the reset voltage of the photoelectric conversion element 10 being represented by Vrst1 and the threshold voltage of the first TFT (11) by Vth1, the output voltage is (Vrst1)−(Vth1) in a dark state (when the signal charge is zero). When signal charges Vsig have been accumulated, the output voltage is (Vrst1)+(Vsig)−(Vth1).

For instance, if the threshold voltage Vth2 of the first TFT (11) has varied by +2 V from its initial threshold voltage Vth1 and a signal charge Vsig has accumulated in three years since the start of its use, its output voltage will be (Vrst1)+(Vsig)−(Vth2), i.e. (Vrst1)+(Vsig)−(Vth1)−2, the output voltage being lower by 2 V, the difference in the threshold voltage. This gives rise to a problem of incorrect signal detection, and in some cases the input rating of the amplifier 15 (a signal read circuit section to be described afterwards) may be surpassed, inviting some device trouble. In this embodiment of the invention, this problem is solved by varying the reset bias Vrst by an equal bias to the variation of the threshold voltage Vth of the first TFT (11) as described above.

The variation of the threshold voltage Vth of the first TFT (11) can be figured out either from the output level obtained in advance in a dark state with no irradiation with light and a known Vrst level or from the function of an experimentally obtained "variations in the duration of use and in the threshold voltage Vth". The first refresh bias Vref1, which is a power supply for refreshing the photoelectric conversion element 10 via the third TFT (13), can be similarly refreshed even after the variation of the threshold voltage Vth in the first TFT (11) by varying it as much as the variation of the reset bias Vrst.

Where carriers having accumulated in the photoelectric conversion element 10 are hole carriers, the condition for refresh should be a relationship of (Vref1)>(Vrst). If (ΔVth) <<(Vref1)−(Vrst) where ΔVth is the variation of the threshold voltage Vth, there will be little need to vary the first refresh bias Vref1.

Whereas Vs represents a sensor bias, when the first refresh bias Vref1 is varied by a variation in the threshold voltage Vth of the first TFT (11), the difference in potential working on the semiconductor layer (Ci) of the photoelectric conversion element 10 varies. This difference in potential determines the saturation charge quantity. It is desirable to set this saturation charge quantity constant all the time. Namely, it is desirable to vary the sensor bias Vs by as much as ΔVth as are the reset bias Vrst and the first refresh bias Vref1.

Vref2 is the second refresh bias for refreshing the photoelectric conversion element 10. A voltage for refreshing is supplied from the Vs wiring (common wiring) by changing over the second switch SW2. The third TFT (13) then is on, and the first switch SW1 is on the reset bias Vrst side. Thus, the D electrode during refresh is at Vref2, and the G electrode is at Vrst. As this reset bias Vrst is varied by the threshold voltage Vth, it is desirable for this second refresh bias Vref2 to be varied similarly to the reset bias Vrst when the second refresh bias is to be used.

In a refresh operation using the second refresh bias Vref2, as the Vs wiring is used in common, an enormous quantity of charges are shifted in a single refresh action, the GND potential and the reference potential of the system vary, and the next read operation cannot be done until their recovery is achieved. This wait period is from 0.5 second to even a few seconds where photoelectric conversion elements of 40 cm square are configured. Therefore, a refresh operation using the second refresh bias Vref2 is unsuitable for moving image photographing where motions are involved. In this embodiment, a refresh operation using the first refresh bias Vref1 is applied to moving image photographing while a refresh operation using the second refresh bias Vref2 is applied to still image photographing.

As hitherto described, in this embodiment of the invention, the reset bias Vrst is varied as much as corresponding to the variation of the threshold voltage Vth in the first TFT (11). Also, correspondingly to that, the first refresh bias Vref1, sensor bias Vs and the second refresh bias Vref2 are also varied.

Figure 2:
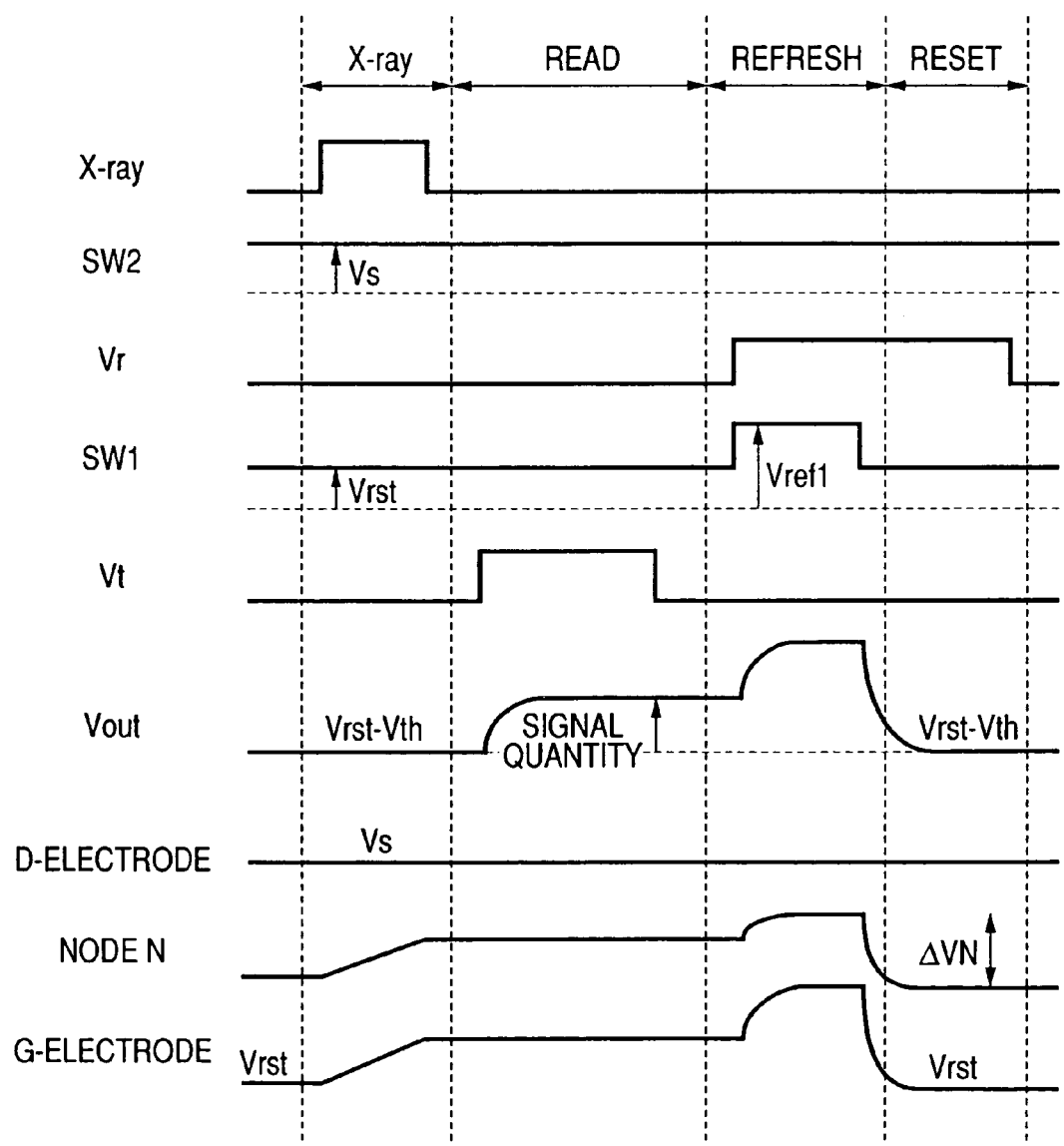
FIG. 2 is a time chart showing the operations in the X-ray image pick-up device shown in FIG. 1.

FIG. 2 is a time chart showing the operations in the X-ray image pick-up device shown in FIG. 1. As shown in FIG. 2, there are four different operational periods including an X-ray irradiation period, a read period, a refresh period and a reset period.

First, the X-ray irradiation period will be described.

As shown in FIG. 2, X-rays are radiated in a pulse form. The X-rays transmitted by the subject irradiate the phosphor FL, which converts the X-rays into visible light. The visible light resulting from conversion by the phosphor then irradiates the semiconductor layer (i layer) of the photoelectric conversion element 10, where it undergoes photoelectric conversion. Hole carriers generated by the photoelectric conversion are accumulated in the interface between the i layer and the insulating layer (injection stopping layer) to raise the potential of the node N. The potential of the G electrode is also raised as much. In the X-ray irradiation period, the first switch SW1 is on the reset bias Vrst and the second switch SW2, on the sensor bias Vs side.

Next, the read period will be described.

The read operation is accomplished by providing a voltage to the gate terminal Vt of the second TFT (12) shown in FIG. 1 and thereby turning it on as a switching element. As a potential corresponding to the quantity of carrier holes (Sh) accumulated by the irradiation with X-rays is applied to the gate of the first TFT (11), turning-on of the second TFT (12) causes a current to flow between the drain and source of the first TFT (11). This causes an output signal to be inputted to the amplifier 15. Then, the gate threshold voltage Vth of the third TFT (13) causes an output signal shifted by an equivalent of Vth from the potential applied to the gate to be supplied.

Next, the refresh operation will be described.

FIG. 2 shows the potentials of the D electrode, the G electrode and the node N when the capacitance content Ci and the capacitance content $C_{SiN}$ are equal to each other. The refresh operation is accomplished by inputting a signal to the gate terminal Vr of the third TFT (13) to place it in an on state as a switching element and connecting the first switch SW1 to the first refresh bias Vref1 side. Then the potential of the node G rises, but the potential of the node N is also raised by Ci=$C_{SiN}$ at the same time at a gradient half as steep. However, the potential of the node N never rises beyond Vs=9 V. Raising the potential of the node N causes part of the signal charges (hole carriers) accumulated in the node N to be discharged to the D electrode side. Namely, the photoelectric conversion element 10 undergoes a refresh operation.

Next, the reset operation will be described.

The reset operation is accomplished by inputting a signal to the gate terminal Vr of the third TFT (13) to turn it on as a switching element and connecting the first switch SW1 to the reset bias Vrst side. This action causes the G electrode of the photoelectric conversion element 10 to be reset to the reset bias Vrst. In this reset operation, the potential of the node N attenuates from the potential at the time of the refresh operation (Vs in FIG. 2). The quantity ΔVN of that attenuation is ½ of the difference in potential between the first refresh bias Vref1 and the reset bias Vrst when the capacitance content Ci and the capacitance content $C_{SiN}$ are equal to each other. The attenuation quantity ΔVN at the node N determines the quantity of hole carriers to be accumulated by the next photoelectric conversion, namely the saturation charge quantity.

Figure 14:
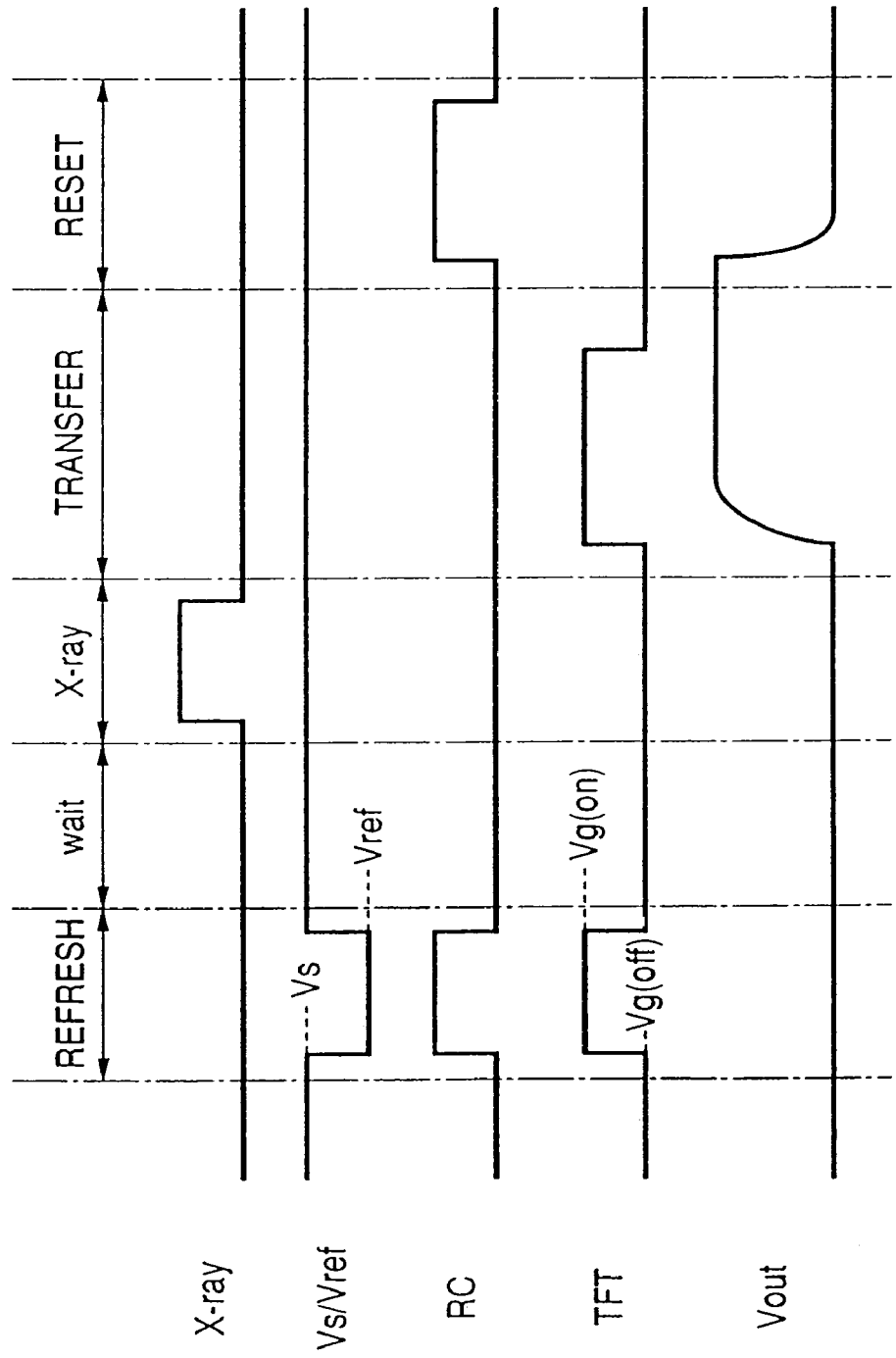
FIG. 14 is a time chart showing the operations in the one-pixel equivalent part of the photoelectric conversion circuit shown in FIG. 13.
Figure 15:
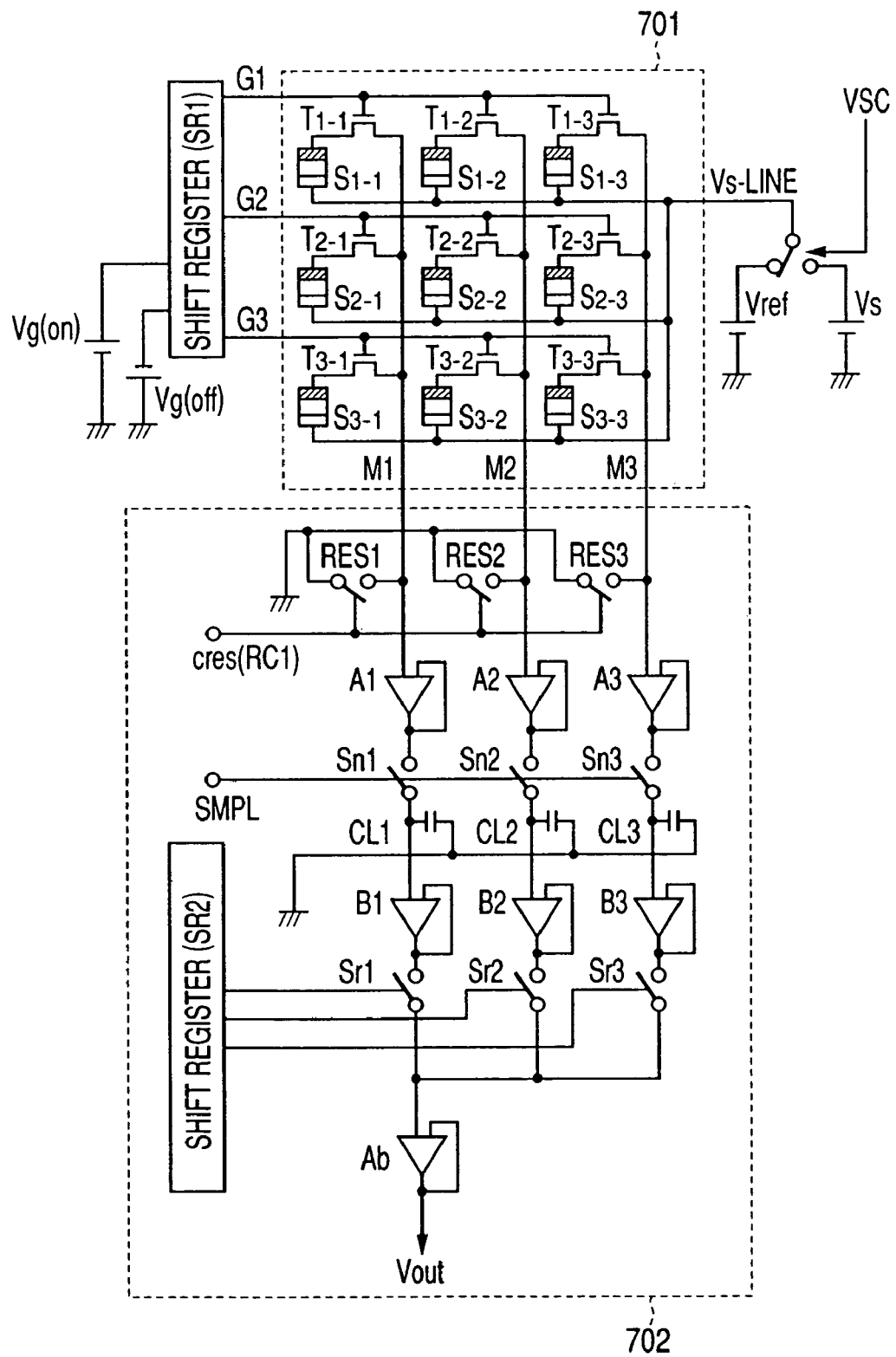
FIG. 15 is a two-dimensional circuit diagram of a conventional X-ray image pick-up device.

While a wait period is provided at the corresponding stage in the conventional process shown in FIG. 14, no wait period is provided in this embodiment shown in FIG. 2. The reason will be described with reference to FIG. 3 and FIG. 4.

Figure 3:
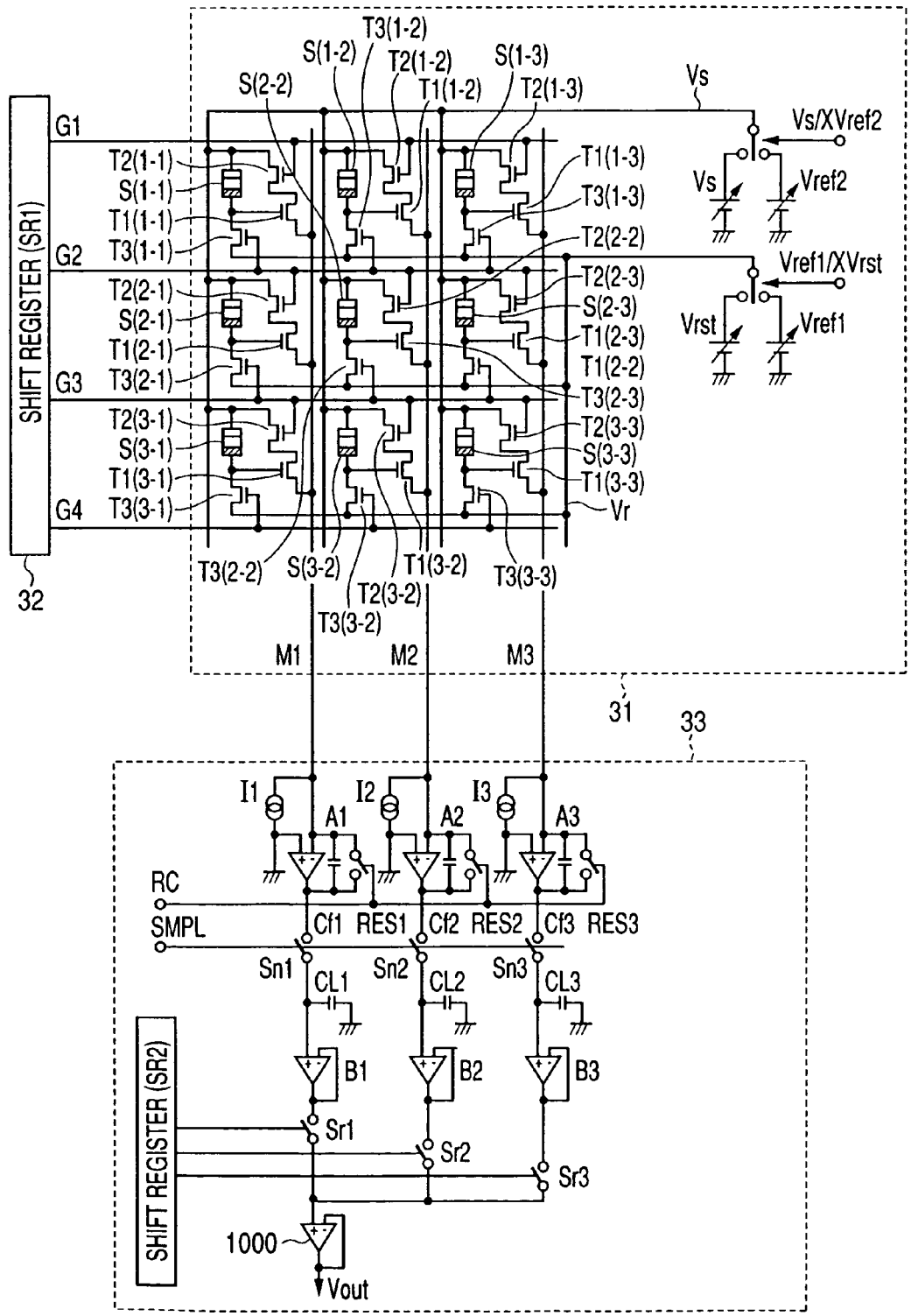
FIG. 3 is a two-dimensional circuit diagram of the X-ray image pick-up device in the preferred embodiment of the invention.

FIG. 3 is a two-dimensional circuit diagram of the X-ray image pick-up device in the preferred embodiment of the invention.

For the sake of simplifying the illustration, only an equivalent of 3×3=9 pixels is shown in FIG. 3. Reference signs S(1—1) through S(3—3) designate photoelectric conversion elements; T1(1—1) through T1(3—3), first TFTs to whose gate terminals the G electrode of the photoelectric conversion element 10 is connected; T2(1—1) through T2(3—3), second TFTs provided for selective reading of electric signals of the photoelectric conversion elements row by row in scanning; and T3(1—1) through T3(3—3), third TFTs provided to refresh or reset the photoelectric conversion elements from which electric signals have been read out.

Reference signs G1 through G4 designate gate wirings for turning on or off T2(1—1) through T2(3—3), which are second TFTs, and T3(1—1) through T3(3—3), which are third TFTs; and M1 through M3, signal wirings. The Vs common wiring is a common wiring for all the pixels to provide the sensor bias (Vs) or the second refresh bias (Vref2) to the D electrodes of the photoelectric conversion elements S(1—1) through S(3—3). A Vr common wiring is a common wiring for all the pixels to provide the reset bias (Vrst) or the first refresh bias (Vref1) to the G electrodes of the photoelectric conversion elements S(1—1) through S(3—3).

The electrodes on the solid black side of the photoelectric conversion elements S(1—1) through S(3—3) are G electrodes, and those on the opposite sides are D electrodes. The thin N⁺ layer, which is partly shared with the Vs common wiring, is used as the D electrodes for the convenience of letting light come incident. The photoelectric conversion elements S(1—1) through S(3—3), first TFTs (T1 (1—1) through T1 (3—3)), second TFTs, (T2(1—1) through T2(3—3)), third TFTs (T3(1—1) through T3(3—3)), gate wirings G1 through G3, signal wirings M1 through M3, Vs common wiring, Vr common wiring sensor bias Vs, second refresh bias Vref2, reset bias Vrst and first refresh bias Vref1 will be collectively referred to as the photoelectric conversion circuit section (radiation detecting circuit section) 31.

The shift register SR1 constitutes a drive circuit section 32 for providing a pulse voltage for the driving purpose to the gate wirings G1 through G4 and turning on or off the second TFTs (T2(1—1) through T2(3—3)) and the third TFTs (T3(1—1) through T3(3—3)) to read out the electric signals of the photoelectric conversion elements S(1—1) through S(3—3) from the first TFTs (T1 (1—1) through T1 (3—3)) on a row-by-row basis.

A read circuit section 33 reads parallel output signals out of the photoelectric conversion circuit section 31, converts them into series, and supplies the converted signals. Reference signs A1 through A3 designate operational amplifiers which connect the signal wirings M1 through M3 to inversion terminals (−). Capacitance elements Cf1 through Cf3 are respectively connected between these inversion terminals (−) and output terminals. Also, current sources I1 through I3 are respectively connected to the signal wirings M1 through M3. The capacitance elements Cf1 through Cf3 accumulate the electric signals of the photoelectric conversion elements S(1—1) through S(3—3) when the second TFTs (T2(1—1) through T2(3—3)) are turned on. Reference signs RES1 through RES3 designate switches which reset the capacitance elements Cf1 through Cf3 and are connected in parallel to the capacitance elements Cf1 through Cf3. In FIG. 3, the reset bias is represented by GND. Reference signs CL1 through CL3 designate sample hold capacitances for temporarily storing signals accumulated in the operational amplifiers A1 through A3 and the capacitance elements Cf1 through Cf3. Reference signs Sn1 through Sn3 designate switches for causing the sample hold capacitances CL1 through CL3 to perform sample holding; B1 through B3, buffer amplifiers; Sr1 through Sr3, switches for converting parallel signals into series; SR2, a shift register for providing Sr1 through Sr3 with pulses for conversion into series; and 1000, an amplifier for outputting signals converted into series.

Figure 4:
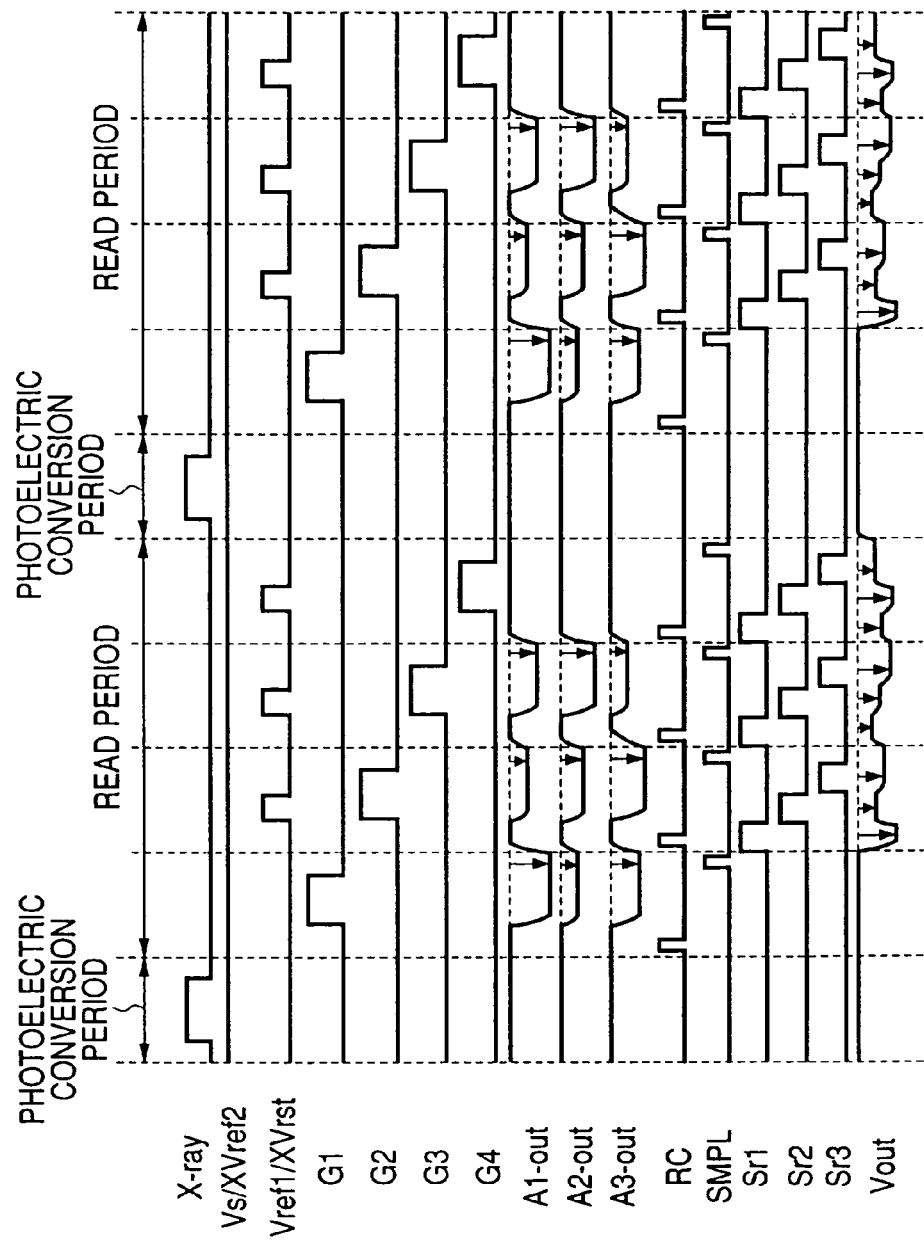
FIG. 4 is a time chart showing the operations in the X-ray image pick-up device shown in FIG. 3.

FIG. 4 is a time chart showing the operations in the X-ray image pick-up device shown in FIG. 3. It shows a two-frame equivalent of operations. The time chart of FIG. 4 shows two operational periods including the photoelectric conversion period and the read period.

First, the photoelectric conversion period will be described.

The D electrodes of all the photoelectric conversion elements S(1—1) through S(3—3) are in a state of being biased by a read power supply VS (positive potential). Every signal of the shift register SR1 is "Lo", and T2(1—1) through T2(3—3), which are the second TFTs, and T3(1—1) through T3(3—3), which are the third TFTs, are off. When X-rays come incident in a pulse manner in this state, the D electrode ($N^+$ electrode) of each photoelectric conversion element is irradiated with visible light via the phosphor, and electrons and hole carriers are generated in the i layer of each photoelectric conversion element. While the electrons then are shifted to the D electrode by the sensor bias Vs, the holes are accumulated in the i layer and the insulating layer within the photoelectric conversion element, and continue to be held after the irradiation with X-rays is stopped.

Next, the read period will be described.

The read operation takes place in the sequence of beginning with the photoelectric conversion elements (S1-1 through S1-3) of the first row, then the photoelectric conversion elements (S2-1 through S2-3) of the second row, and finally the photoelectric conversion elements (S3-1 through S3-3) of the third row.

First to read out the photoelectric conversion elements (S1-1 through S1-3) of the first row, a gate pulse is provided from the shift register SR1 to the gate wiring G1, and the second TFTs (T2(1—1) through T2(1-3)) of the first row are thereby turned on. A drain current is thereby caused to flow to the first TFTs (T1 (1—1) through T1 (1-3)) of the first row to whose gate terminals potentials matching the signal charges of the photoelectric conversion elements (S1-1 through S1-3) of the first row, and the current flows into the capacitance elements Cf1 through Cf3 connected to the operational amplifiers A1 through A3 at the first stage of the read circuit section 33 to be integrated therein.

The terminals of the operational amplifiers A1 through A3 vary as shown in FIG. 4 according to the signal quantities of the photoelectric conversion elements. As the second TFTs (T2(1—1) through T2(1-3)) of the first row are turned on simultaneously, the outputs of the operational amplifiers A1 through A3 vary at the same time. Thus they are parallel outputs. By turning on an "SMPL" signal on in that state, the output signals of the operational amplifiers A1 through A3 are transferred to the sample hold capacitances CL1 through CL3 and, as the SMPL signal is turned off, once held therein. Then, a pulse is applied from the shift register SR2 to the switches Sr1, Sr2 and Sr3 in that order, and an output is provided to CL2 and CL3 in that order from the amplifier 1000. As a result, the photoelectrically converted signals of the photoelectric conversion elements (S1-1 through S1-3) of the first row are successively converted into series and outputted. The read operation on the photoelectric conversion elements (S2-1 through S2-3) of the second row and the read operation on the photoelectric conversion elements (S3-1 through S3-3) of the third row are accomplished in the same manner.

When the SMPL signal of the first row causes the signals of the operational amplifiers A1 through A3 to be sample-held by the sample hold capacitances CL1 through CL3, it means that the signals of the photoelectric conversion elements (S1-1 through S1-3) of the first row have been outputted from the photoelectric conversion circuit section 31. Therefore, the refresh operation or the reset operation of the photoelectric conversion elements (S1-1 through S1-3) of the first row within the photoelectric conversion circuit section 31 or the reset operation of the capacitance elements Cf1 through Cf3 can be performed while conversion into series by the switches Sr1 through Sr3 is taking place within the read circuit section 33.

In this embodiment, the refresh operation of the photoelectric conversion elements (S1-1 through S1—3) of the first row is performed at the same time as the read operation of the photoelectric conversion elements (S2-1 through S2-3) of the second row. To realize this, the gate wiring for controlling the third TFTs (T3(1—1) through T3(1—3)) of the first row is the same gate wiring G2 for controlling the second TFTs (T2(2—1) through T2(2—3)) of the second row. Thus the same gate wiring is shared by the two rows.

The rise of a Vref1/XVrst signal to "Hi" while the gate wiring G2 is on causes the Vr common wiring to be biased by Vref1, and the photoelectric conversion elements (S1-1 through S1—3) of the first row to be refreshed. After that, similarly, the fall of the Vref1/XVrst signal to "Lo" while the gate wiring G2 is on causes the Vr common wiring to be biased by the reset bias Vrst, and the G electrodes of the photoelectric conversion elements (S1-1 through S1—3) of the first row are reset by the reset bias Vrst. While this gate wiring G2 is on, the second TFTs (T2(2—1) through T2(2—3)) of the second row are on at the same time, potentials matching the signal charges of the photoelectric conversion elements (S2-1 through S2-3) of the second row are similarly read out. In this way, the refresh operation and the reset operation of the photoelectric conversion elements of the n-th row and of the photoelectric conversion elements of the (n−1)-th row are carried out at the same time in this embodiment of the invention.

By the operations described so far, the signal charges of all the photoelectric conversion elements S(1—1) through S(3—3) of the first through third rows can be outputted.

Figure 16:
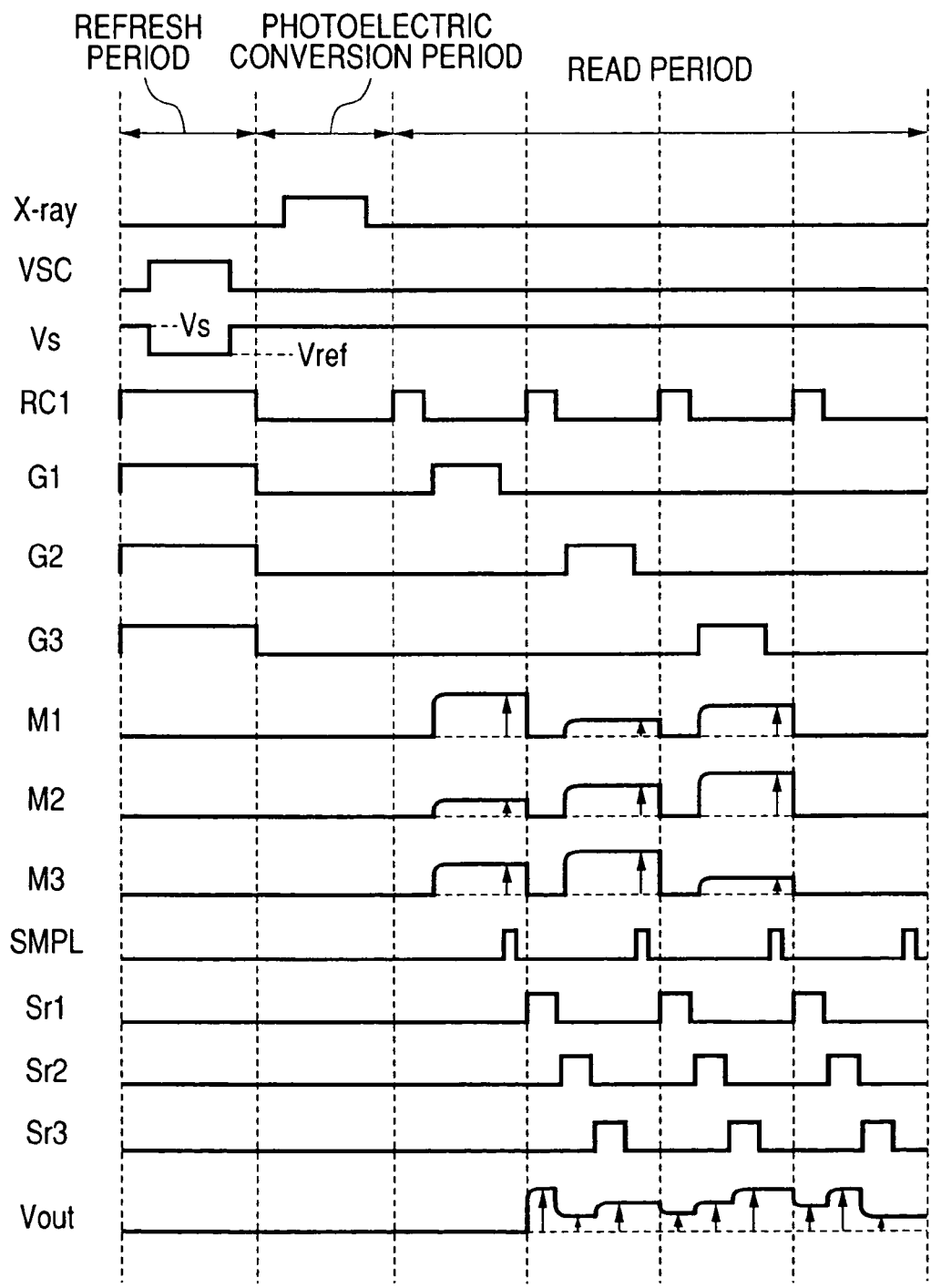
FIG. 16 is a time chart showing the operations in the conventional X-ray image pick-up device.

By performing the operations described above to repeat the photoelectric conversion period and the read period, consecutive moving images can be acquired. The difference of the time chart of this embodiment from the time chart of FIG. 16 representing the prior art is the absence of the refresh period, and the frame frequency in acquiring motion images can be increased correspondingly. Moreover, the prior art requires a wait period to reduce fluctuations in GND and power supply due to the dark current component occurring at the time of refresh because all the photoelectric conversion elements are refreshed collectively. In this embodiment, since refreshing is done row by row, the number of photoelectric conversion elements refreshed at a time is far smaller, there is no need for a separate wait period, and the frame frequency of moving images can be increased correspondingly.

Figure 5:
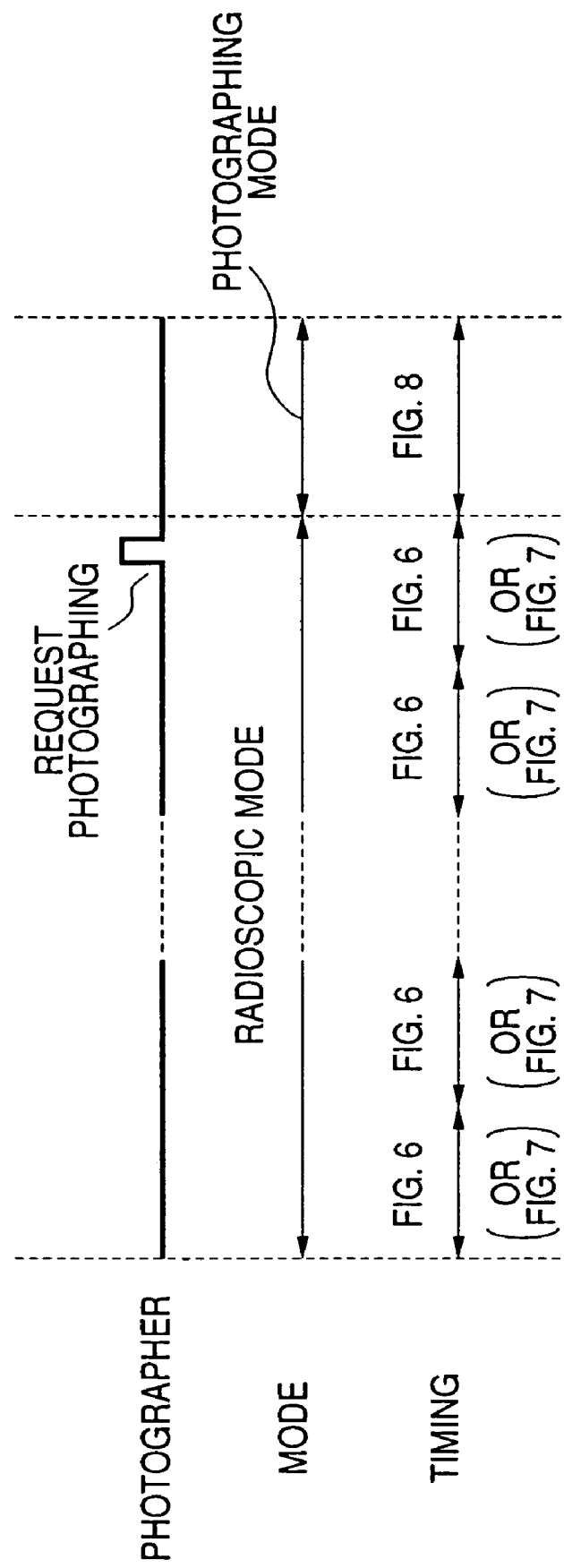
FIG. 5 shows the photographic sequence of the X-ray image pick-up device in the preferred embodiment of the invention.

FIG. 5 shows the photographic sequence of the X-ray image pick-up device in the preferred embodiment of the invention. FIG. 5 shows the photographing sequence involving a transition from a state of operation in a radioscopic mode (moving image mode) to a photographing mode (still image mode) at the photographer's demand for photographing of a still image.

Figure 6:
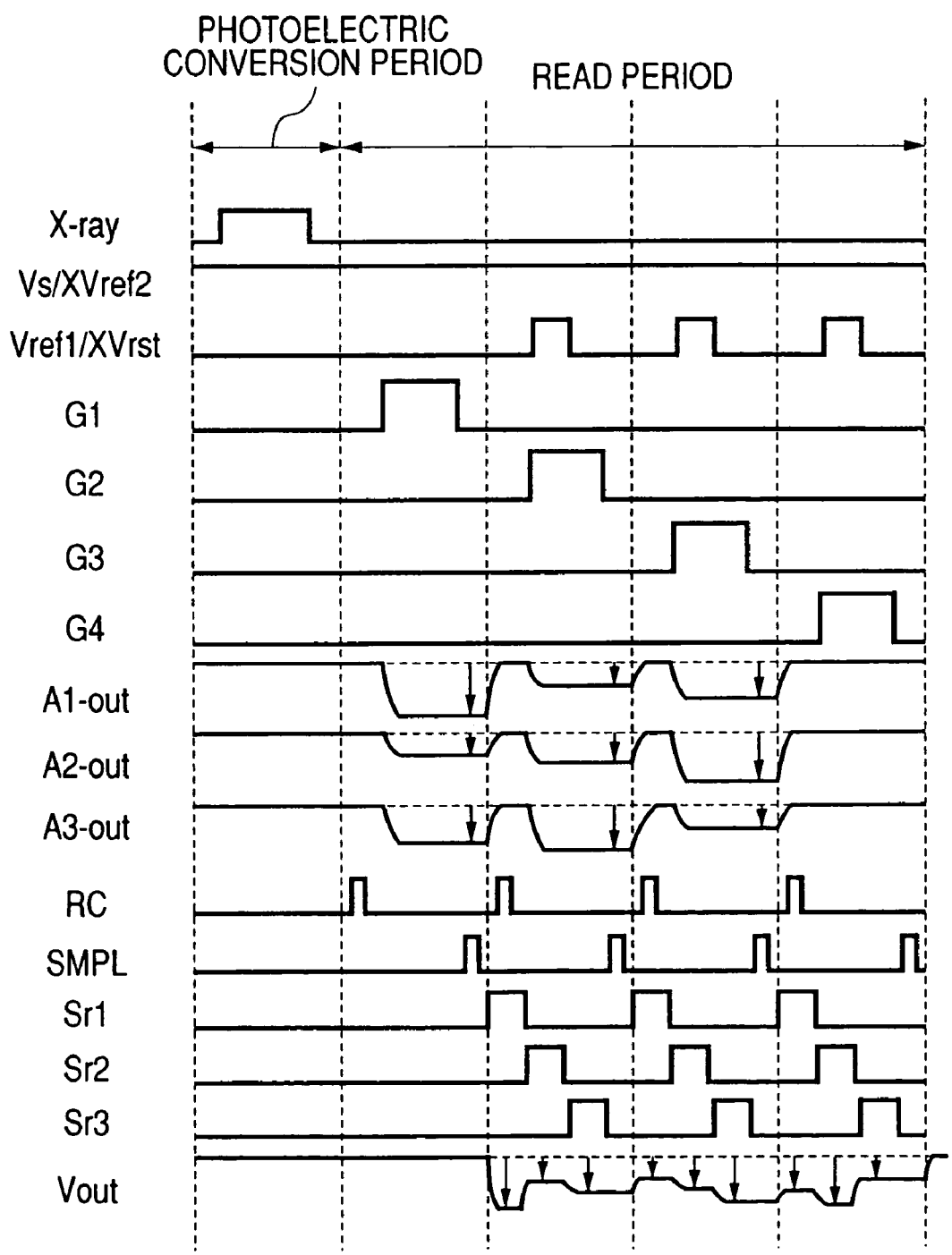
FIG. 6 is a time chart of the X-ray image pick-up device shown in FIG. 5 in a radioscopic mode (moving image mode)
Figure 8:
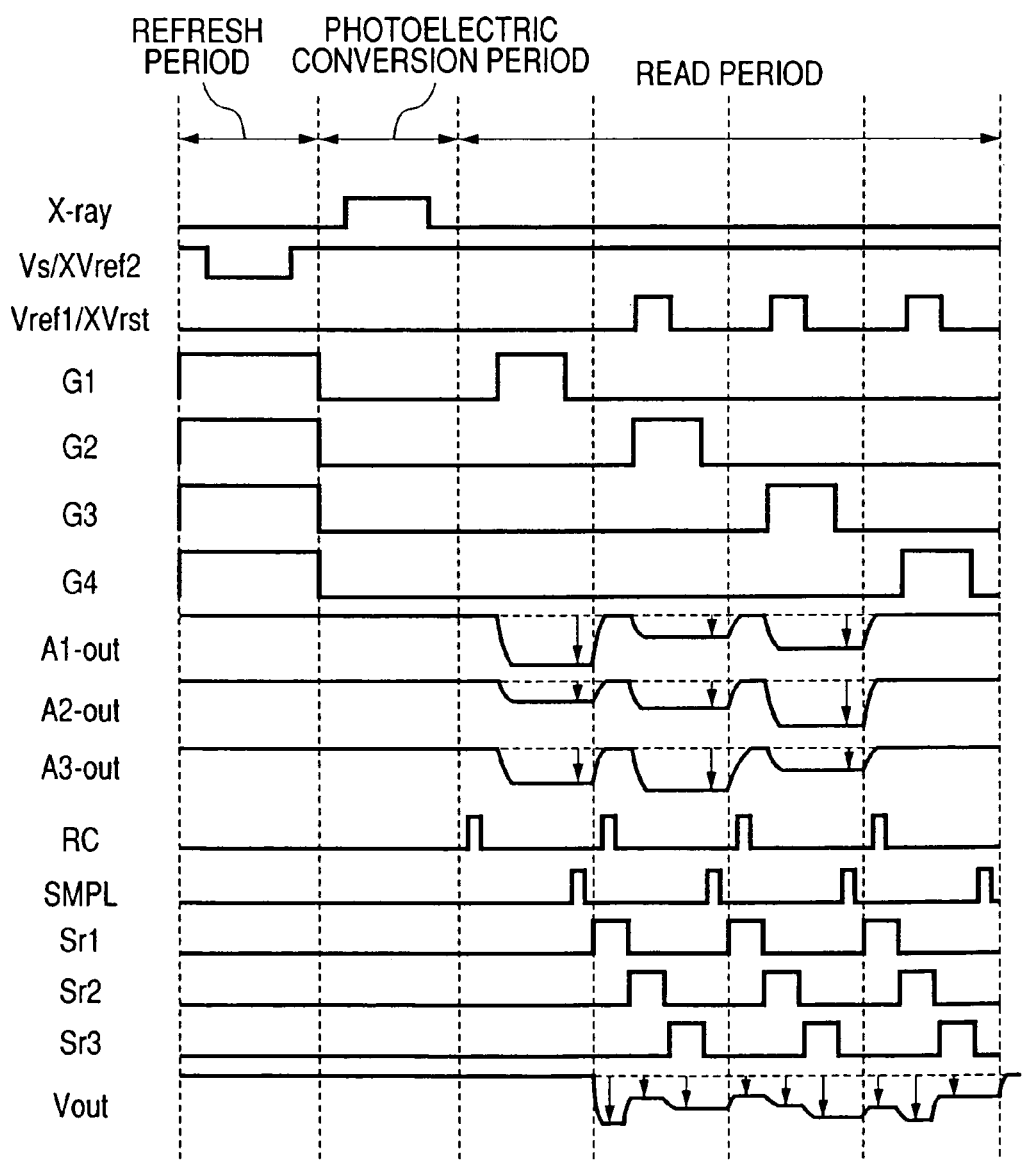
FIG. 8 is a time chart of the X-ray image pick-up device shown in FIG. 5 in a photographing mode (still image mode)

FIG. 6 is a time chart of the X-ray image pick-up device shown in FIG. 5 in the radioscopic mode (moving image mode). Thus in the radioscopic mode, the timing operation charted in FIG. 6 is repeated. During this period, to determine the position and angle of the subject (patient) for photographing his or her still image, the photographer is monitoring radioscopic images of the patient. Usually during this period, irradiation is performed with a smaller dose of X-rays. When the photographer issues to the X-ray image pick-up device an exposure demand signal (a signal of intent to photograph a still picture), transition takes place from the radioscopic mode to the photographing mode. Operational timings in the photographing mode are shown in FIG. 8. The flow from the radioscopic mode to the photographing mode does not always involve the photographing mode only once as shown in FIG. 5, but the photographing mode can be repeated as many times as desired, such as the radioscopic mode→the photographing mode→the radioscopic mode→the photographing mode and so forth, according to the image composition of photographing the subject.

Figure 7:
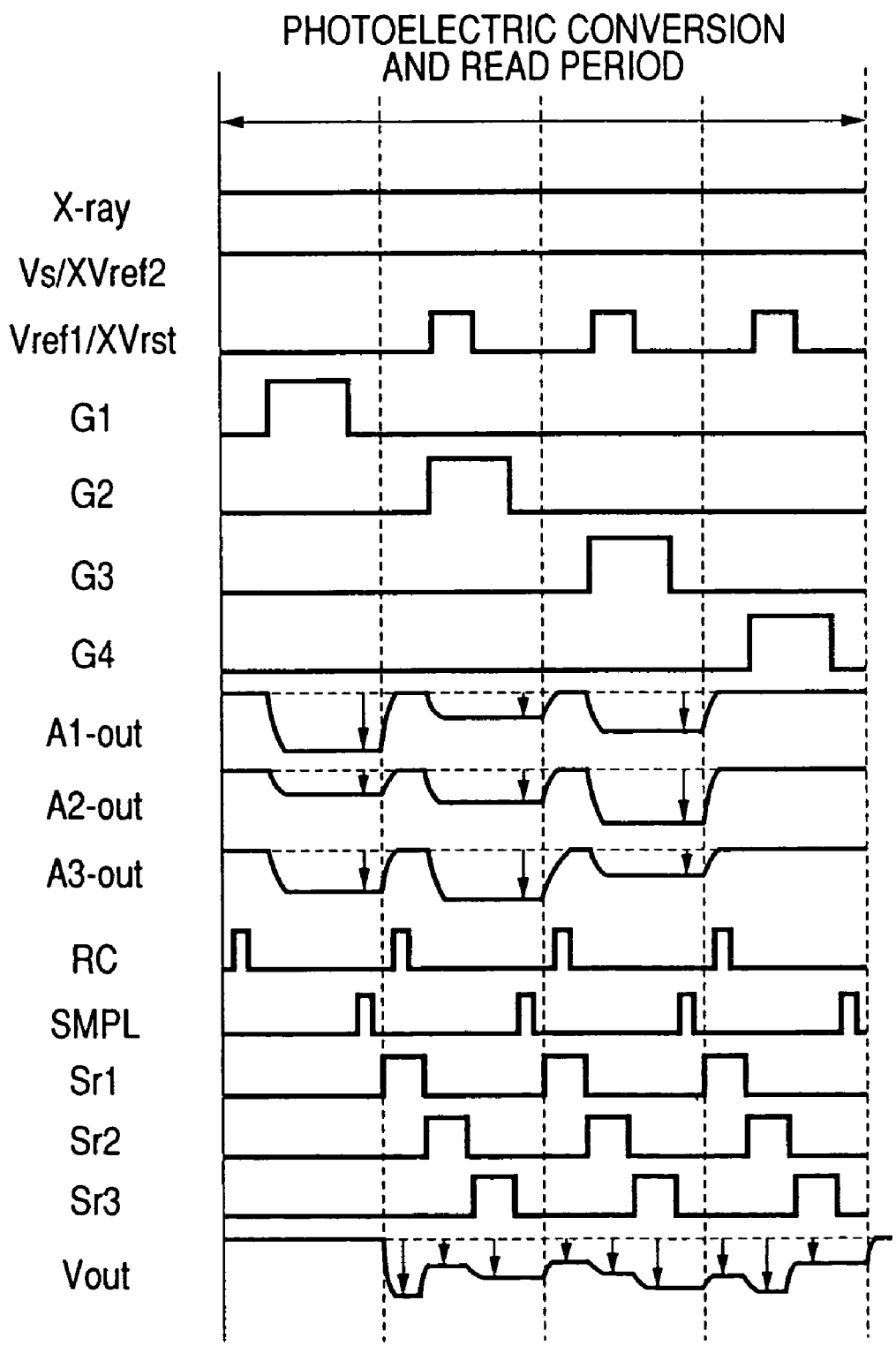
FIG. 7 is another time chart of the X-ray image pick-up device shown in FIG. 5 in the radioscopic mode (moving image mode)

FIG. 7 is another time chart of the X-ray image pick-up device shown in FIG. 5 in the radioscopic mode differing from what is shown in FIG. 6. The difference from FIG. 6 consists in that X-rays are not radiated in a pulse form. This makes possible operations in the read period and in the photoelectric conversion period at the same time, resulting in an advantage that the operational frequency in the radioscopic mode can be raised. Furthermore, since X-rays do not come incident in a pulse form, the load on the X-ray generation source can be alleviated.

Where the X-ray image pick-up device according to the invention is applied to a radioscopic apparatus, in the radioscopic mode, the first refresh bias Vref1 is provided via the third TFTs (T3(1—1) through T3(3—3)), positioning and other aspects are determined by radioscopy and, in case of transition to a still image photographing mode, the second refresh bias Vref2 is provided from the Vs common wiring. Since refreshing from the Vs common wiring covers all the pixels at a time, fluctuations of the GND potential and the reference potential of the system become greater after the refresh operation, resulting in a disadvantage that the next read operation cannot be done until their recovery is achieved, and this is unsuitable for moving image photography (radioscopy). At the same time, however, the absence of intervening TFTs provides an advantage that a large saturation charge can be set because a large potential difference between the Vs common wiring and the second refresh bias Vref2 can be secured. Thus, for still image photographing to obtain images for diagnostic use, it is more advantageous to be assured of a high S/N ratio by refreshing with the second refresh bias Vref2 from the common wiring Vs side.

Figure 9:
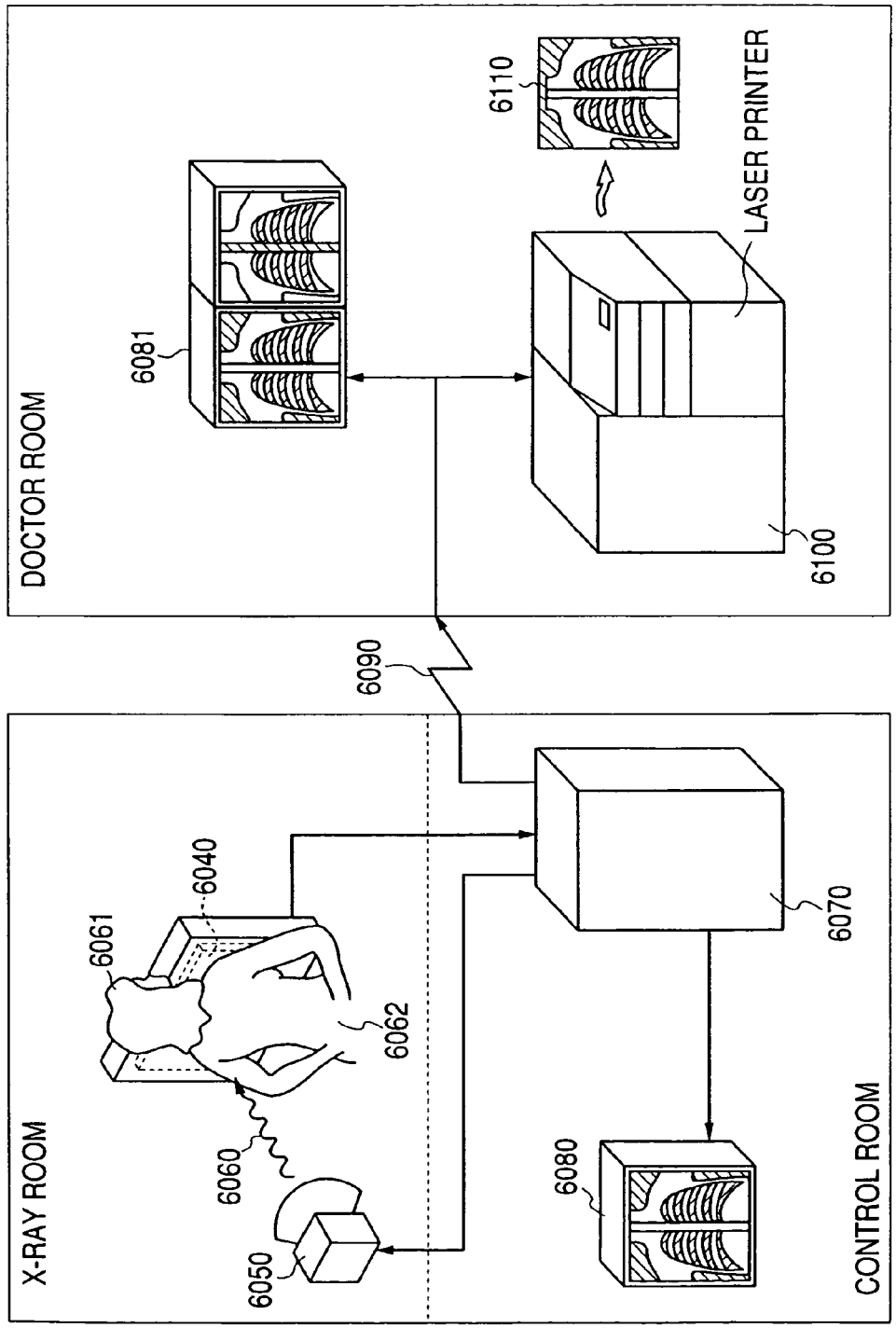
FIG. 9 shows a schematic view of an example of application of the X-ray image pick-up device in the preferred embodiment of the invention to an X-ray diagnosing system.
Figure 10:
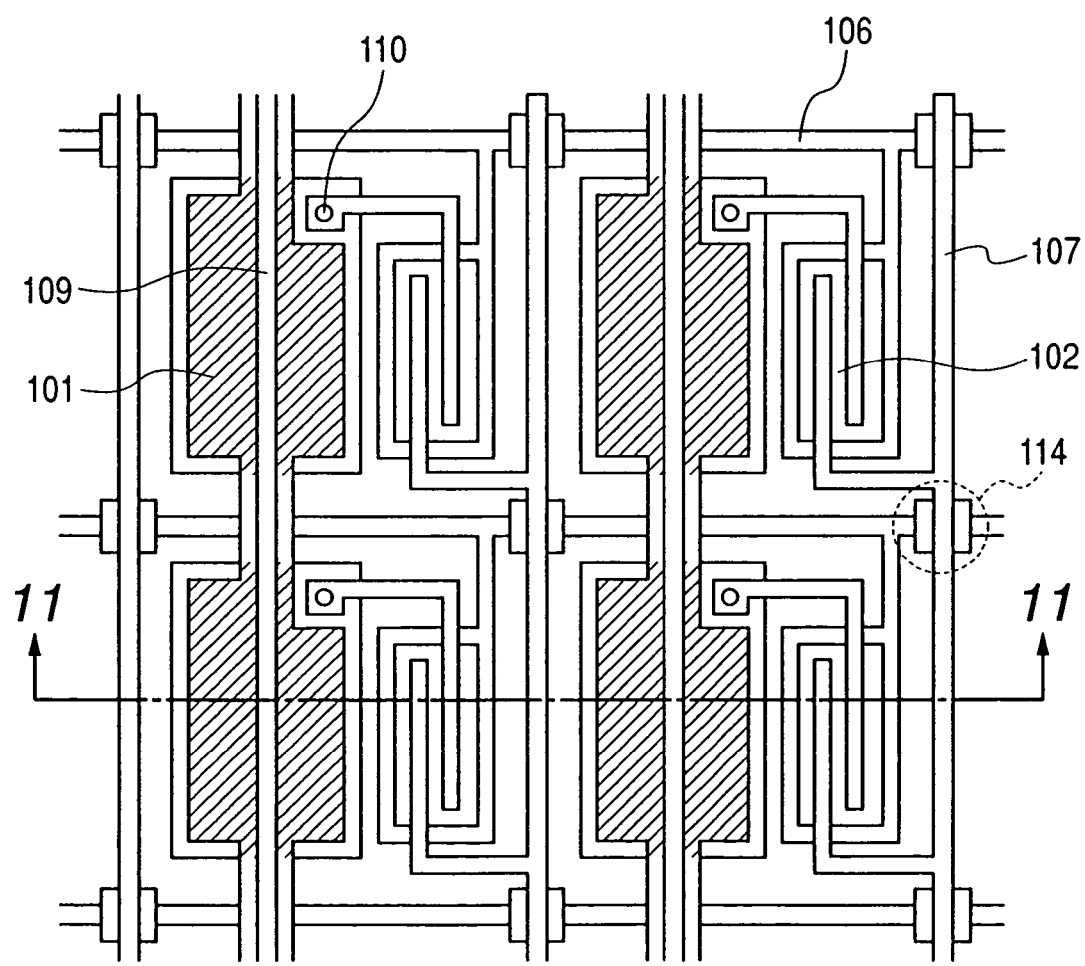
FIG. 10 shows a plan of a photoelectric conversion substrate configured by using amorphous silicon semiconductor films as materials for a photoelectric conversion element and a switching element.

FIG. 9 shows a schematic view of an example of application of the X-ray image pick-up device in the preferred embodiment of the invention to an X-ray diagnosing system.

X-rays 6060 generated by an X-ray tube 6050 are transmitted by the chest 6062 of a patient or subject 6061, and come incident on a radiation image pick-up device (image sensor) 6040. These incident X-rays contain information on the internal conditions of the body of the subject 6061. In response to the incidence of the X-rays, the information is converted by a phosphor into visible light, which further undergoes photoelectric conversion to give electric signals. These electric signals are converted into digital signals, which undergo image processing by an image processor 6070, and the resultant image is observed on a display 6080 in a control room.

This visual information can be transferred to a remote location by transmission means, such as a telephone line 6090, can be displayed on a display 6081 or stored on a storage medium, such as an optical disk in another place such as a doctor room, and enables a doctor in a remote location to diagnose the photographed patient. Also, the visible information can be recorded on a film 6110 by a film processor 6100.

Although the foregoing description of the embodiment of the invention referred to an X-ray image pick-up device or an X-ray image pick-up system, it is also possible to convert radiations, such as γ-rays, α-rays or β-rays into light, and apply the resultant light to a photoelectric conversion apparatus. The photoelectric conversion element array according to the invention can as well be used in a usual image pick-up device for detecting visible light or infrared rays. It is preferable for the field effect transistors for use in the invention to be thin-film transistors in which channel domains are formed by using a non-single crystal semiconductor, such as amorphous silicon hydride, and their form is not limited to the lower gate stagger type, but the upper gate stager type or the upper gate coplanar type transistors can as well be used.

Figure 11:
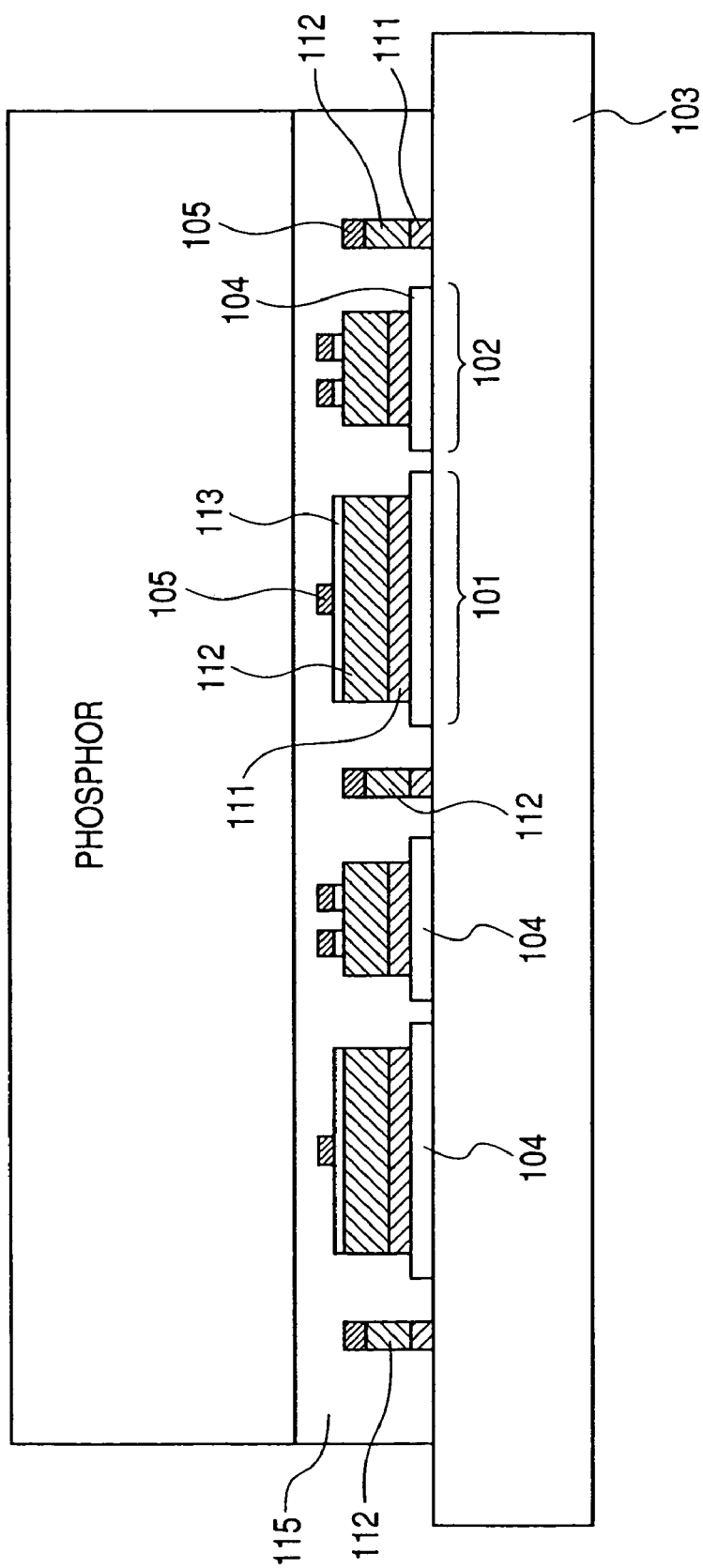
FIG. 11 shows a section cut along line 11—11 in FIG. 10.
Figure 12A:
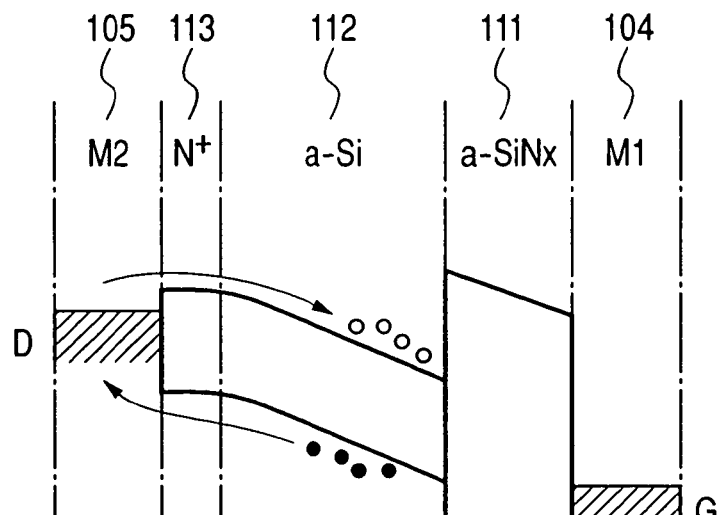
FIGS. 12A, 12B and 12C are energy band diagrams illustrating the device operations of the photoelectric conversion elements shown in FIG. 10 and FIG. 11.
Figure 12B:
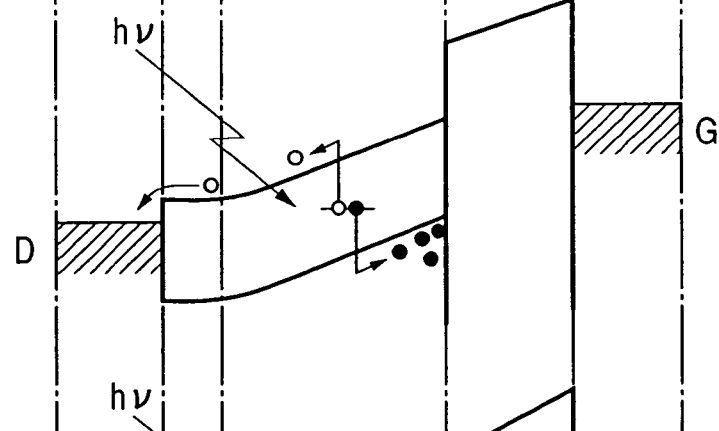
Figure 12C:
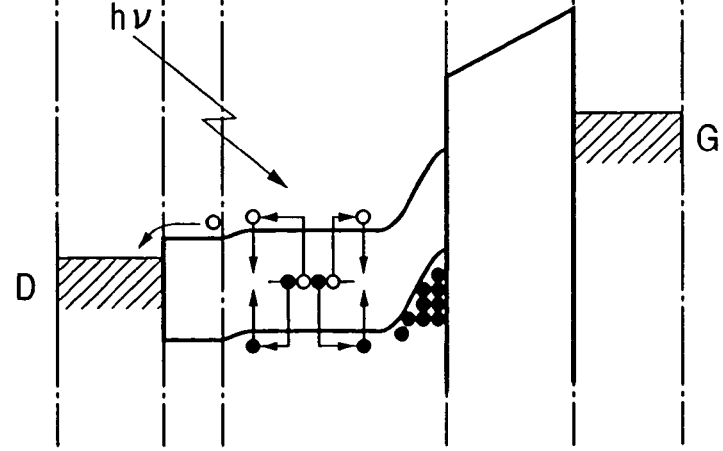
Figure 13:
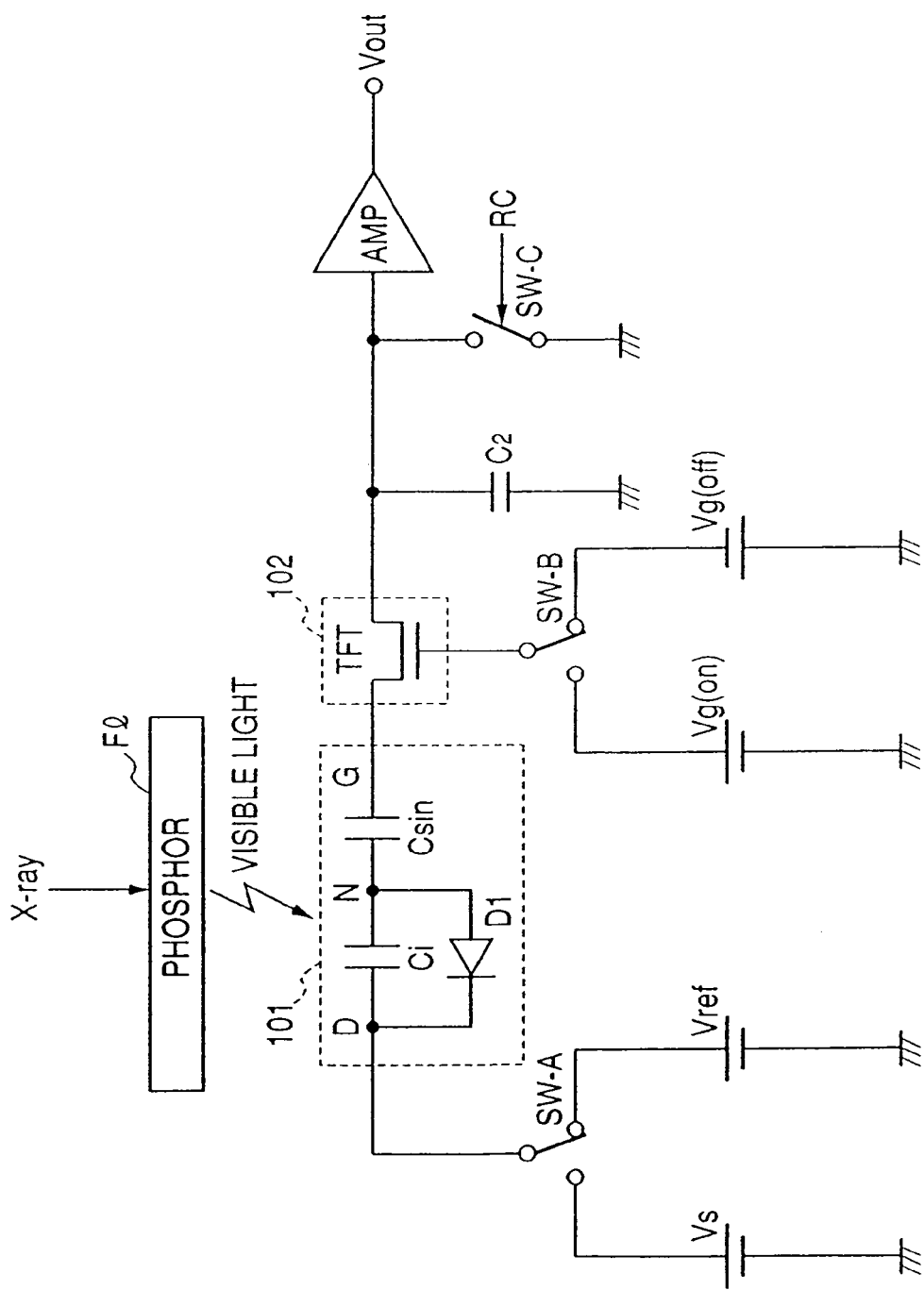
FIG. 13 shows a one-pixel equivalent part of a photoelectric conversion circuit, whose configuration comprises a photoelectric conversion element and a TFT, photoelectric conversion element TFT.

The MIS-type photoelectric conversion element 10 in this embodiment has a similar layer configuration to the photoelectric conversion element 101 shown in FIG. 11. Thus, it has a first metallic film layer 104 formed as a lower electrode over an insulating substrate 103, an insulating layer 111 consisting of amorphous silicon nitride and formed over the first metallic thin film layer to obstruct the passage of electrons and positive holes, a photoelectric conversion layer 112 consisting of amorphous silicon hydride and formed over the insulating layer, an N-type injection stopping layer 113 formed over the photoelectric conversion layer to obstruct the injection of positive holes, and a transparent conducting layer formed as an upper electrode over the injection stopping layer or a second metallic film layer 105 formed over part of the injection stopping layer. Regarding the device operations of the MIS-type photoelectric conversion element 10, as shown in FIGS. 12A to 12C, in the refresh mode (FIG. 12A) it provides an electric field in the direction of guiding positive holes from the photoelectric conversion layer 112 toward the second metallic film layer 105, while in the photoelectric conversion mode (FIG. 12B) it provides an electric field in the direction of causing positive holes, generated by radiations coming incident on the photoelectric conversion layer 112, to stay in the photoelectric conversion layer and to guide electrons toward the second metallic film layer 105. In the photoelectric conversion mode, it detects as optical signals the positive holes accumulated in the photoelectric conversion layer 112 or the electrons guided toward the second metallic film layer 105.

Since the read-out MIS-type photoelectric conversion elements 10 are refreshed (or reset) row by row in this embodiment of the invention, it requires a smaller number of photoelectric conversion elements 10 to be refreshed than the conventional X-ray image pick-up device which collectively refresh all the pixels, the transient current flowing immediately after each refresh operation can be reduced, voltage fluctuations on GND and power supply lines restrained, frame-by-frame wait periods dispensed with, and stable and high speed moving image photographing made possible. Furthermore, as the photoelectric conversion elements 10 are in a MIS-type configuration, unlike the PIN-type configuration, there is no need to form P layers, a dark current can be suppressed and the radiation image pick-up device can be fabricated at lower cost.

Also, as the electric signals of the conversion elements are read out via the source follower-type first field effect transistor, they can be read out without reducing the output signals of the conversion elements, resulting in a higher S/N ratio than the conventional radiation image pick-up device. This eliminates the need to have an amplifier of a low noise design at the initial stage of the read circuit section as in the conventional device. Nor is it necessary to increase the element size. Accordingly the read circuit section can be reduced in current consumption and in heat emission. This provides the advantage of simplifying the otherwise complex heat radiation mechanism of the device and increasing the design freedom of the device shape.

Further, as the bias value of the reset bias Vrst is made variable, the MIS-type photoelectric conversion elements 10 can be reset to any desired voltage via the third TFT (13). Since this enables the accumulation start voltage applied to the gate terminal of the first TFT (11) to be determined at Vrst, whatever level the threshold voltage (Vth) of the first TFT (11) may have, the voltage level to be outputted to the read circuit section 33 can be adjusted to (Vrst)−(Vth) at the start of accumulation. As this can compensate for any variation that may occur to the threshold voltage (Vth) of the first TFT (11), the electric signals of the MIS-type photoelectric conversion elements 10 can be stably outputted, making it possible to achieve a highly reliable radiation image pick-up device.

Whereas the MIS-type photoelectric conversion elements 10 are refreshed by the first refresh bias Vref1 via the third TFT (13) in this embodiment, when the hole carriers accumulated in the MIS-type photoelectric conversion elements 10 are to be refreshed, there should be a relationship of (Vrst)<(Vref1). Therefore, while the reset bias Vrst can be altered according to the first TFT (11) threshold voltage (Vth) in this embodiment, the first refresh bias Vref1 can be similarly altered.

Since the photoelectric conversion elements 10, first TFTs (11), second TFTs (12) and third TFTs(13) constituting the pixels are mainly formed of an amorphous silicon semiconductor, the photoelectric conversion elements and the field effect transistors can be fabricated over the same substrate, enabling the yield of radiation image pick-up devices in the manufacturing process to be enhanced.

As many apparently widely different embodiments of the present invention can be made without departing from the spirit and scope thereof, it is to be understood that the invention is not limited to the specific embodiments thereof except as defined in the claims.

This application claims priority from Japanese Patent Application No. 2003-408032 filed on Dec. 5, 2003, which is hereby incorporated by reference herein.

What is claimed is:

1. A radiation image pick-up device having:
   a radiation detecting circuit section in which a plurality of pixels for detecting incident radiations are two-dimensionally arranged over a substrate, and
   a drive circuit section for driving said radiation detecting circuit section, wherein:
   said pixels comprise:
   MIS-type conversion elements for converting the incident radiations into electric signals,
   source follower-type first field effect transistors for reading out electric signals resulting from the conversion by said conversion elements,
   second field effect transistors provided to read out the electric signals of said conversion elements selected row by row by said drive circuit section from said first field effect transistors, and
   third field effect transistors provided to reset or refresh row by row said conversion elements read out by said first field effect transistors, and
   wherein either (1) one type electrodes of said conversion elements are connected via said third field effect transistor to a first switch for switching between a reset bias for performing said resetting and a first refresh bias for performing said refreshing, or
   the (2) other type electrodes of said conversion elements are connected via a bias wiring common to individual conversion elements to a second switch for switching between a sensor bias for providing the converting operations by said conversion elements and a second refresh bias for refreshing the electric signals of said conversion elements.

2. The radiation image pick-up device according to claim 1, wherein
   one type electrodes of said conversion elements are connected via said third field effect transistor to the first switch for switching between the reset bias for performing said resetting and the first refresh bias for performing said refreshing, and
   the other type electrodes of said conversion elements are connected via a bias wiring common to individual conversion elements to the second switch for switching between the sensor bias for providing the converting operations by said conversion elements and the second refresh bias for refreshing the electric signals of said conversion elements.

3. The radiation image pick-up device according to claim 2, wherein, in the refreshing of said conversion elements, said first refresh bias is used for acquiring moving images and said second refresh bias is used for acquiring still images.

4. The radiation image pick-up device according to claim 2, wherein at least one bias value out of said reset bias, said first refresh bias, said sensor bias and said second refresh bias is determined according to the gate threshold voltage in said first field effect transistors.

5. The radiation image pick-up device according to claim 1, further comprising a read circuit section for reading out output signals from said radiation detecting circuit section, and said read circuit section comprises amplifying means for amplifying the output signals from said radiation detecting circuit section, accumulating means for temporarily accumulating the amplified output signals, and serial conversion means for subjecting the accumulated output signals to serial conversion.

6. The radiation image pick-up device according to claim 1, wherein said conversion elements, said first field effect transistors, said second field effect transistors, and said third field effect transistors are formed mainly of an amorphous silicon semiconductor.

7. The radiation image pick-up device according to claim 1, wherein said conversion elements are configured to have a first metallic thin film layer formed over said substrate as a lower electrode, an insulating layer formed over said first metallic thin film layer and consisting of amorphous silicon nitride for obstructing the passage of electrons and positive holes, a photoelectric conversion layer formed over the insulating layer and consisting of amorphous silicon hydride, an N-type injection stopping layer formed over the photoelectric conversion layer to obstruct the injection of positive holes, and a transparent conducting layer formed as an upper electrode over the injection stopping layer or a second metallic film layer formed over part of the injection stopping layer, in a refresh mode, said conversion elements are given an electric field in the direction of guiding positive holes from said photoelectric conversion layer to said second metallic thin film layer, in a photoelectric conversion mode, said conversion elements are given an electric field to cause positive holes, generated by radiations coming incident on said photoelectric conversion layer, to stay in the photoelectric conversion layer and to guide electrons toward the second metallic film layer, and said positive holes accumulated in said photoelectric conversion layer in said photoelectric conversion mode or said electrons guided toward said second metallic thin film layer are detected as optical signals.

8. The radiation image pick-up device according to claim 1, further comprising a wavelength converter for converting the wavelengths of said radiations.

9. The radiation image pick-up device according to claim 8, wherein said wavelength converter has as its main content one of $Gd_2O_2S$, $Gd_2O_3$ and CsI.

10. A radiation image pick-up method for use in a radiation image pick-up device having a radiation detecting circuit section in which pixels provided with MIS-type conversion elements for converting incident radiations into electric signals, source follower-type first field effect transistors for reading out the electric signals, second field effect transistors provided to read out the electric signals of the selected one of said conversion elements from said first field effect transistors, and third field effect transistors provided to reset the first field effect transistor or refresh said conversion elements are two-dimensionally arranged over a substrate, and a drive circuit section for driving said radiation detecting circuit section, characterized in that:

when the electric signals of said conversion elements are read out of said first field effect transistors, they are read out row by row by causing said drive circuit section to drive said second field effect transistors row by row, and said conversion elements out of which reading has been accomplished are reset or refreshed row by row by said third field effect transistors.

* * * * *